(12) United States Patent
Heumann et al.

(10) Patent No.: US 8,933,660 B2
(45) Date of Patent: Jan. 13, 2015

(54) STOWABLE TRACKING PHOTOVOLTAIC ARRAY

(75) Inventors: Michael C Heumann, Sebastopol, CA (US); Stephan R Heumann, Mountain View, CA (US)

(73) Assignee: Empire Technology Development LLC, Wilmington, DE (US)

( * ) Notice: Subject to any disclaimer, the term of this patent is extended or adjusted under 35 U.S.C. 154(b) by 115 days.

(21) Appl. No.: 13/810,279

(22) PCT Filed: Jul. 24, 2012

(86) PCT No.: PCT/US2012/047965
§ 371 (c)(1),
(2), (4) Date: Jan. 15, 2013

(87) PCT Pub. No.: WO2014/018015
PCT Pub. Date: Jan. 30, 2014

(65) Prior Publication Data
US 2014/0028240 A1    Jan. 30, 2014

(51) Int. Cl.
*H02J 7/00* (2006.01)
*H02S 30/20* (2014.01)
*F24J 2/52* (2006.01)
(Continued)

(52) U.S. Cl.
CPC ............. *H01L 31/045* (2013.01); *H02J 7/0052* (2013.01); *F24J 2/52* (2013.01); *H01L 31/042* (2013.01); *H01L 31/0422* (2013.01); *H01L 31/0508* (2013.01); *H02J 7/355* (2013.01);
(Continued)

(58) Field of Classification Search
USPC .......................................... 320/101; 136/245
See application file for complete search history.

(56) References Cited

U.S. PATENT DOCUMENTS 5,296,044 A    3/1994 Harvey
5,986,429 A *  11/1999 Mula, Jr. ...................... 320/101
(Continued)

FOREIGN PATENT DOCUMENTS

| CN | 201268235 Y | 7/2009 |
| DE | 102009034794 A1 | 1/2011 |
| WO | PCT/WO2012/063234 | 5/2012 |
| WO | PCT/US2012/047965 | 7/2012 |

OTHER PUBLICATIONS

International Searching Authority, International Search Report and Written Opinion of the International Searching Authority for PCT/US2012/047965, Oct. 5, 2012.

(Continued)

*Primary Examiner* — Edward Tso
*Assistant Examiner* — Ramy Ramadan
(74) *Attorney, Agent, or Firm* — Jensen & Puntigam, PS

(57) ABSTRACT

Technologies related to a photovoltaic array apparatus are generally described. In some examples, the apparatus may comprise a central hub, adjustable length struts, and a plurality of photovoltaic segments coupled to the central hub and struts. The photovoltaic segments may be selectively positioned between a stowed arrangement and a deployed arrangement by operation of the central hub and/or struts. In the stowed arrangement, the photovoltaic segments may be stacked, and in the deployed arrangement, the photovoltaic segments may be azimuthally displaced about the central hub. A control system coupled to the struts may be configured to control the struts to dynamically orient the photovoltaic segments so as to maximize, or otherwise adjust, power collected from incident radiation.

31 Claims, 8 Drawing Sheets

(51) Int. Cl.
*H01L 31/042* (2014.01)
*H01L 31/05* (2014.01)
*H02J 7/35* (2006.01)
*B60K 15/10* (2006.01)
*B60K 16/00* (2006.01)

(52) U.S. Cl.
CPC ........... *B60K15/10* (2013.01); *B60K 2016/003* (2013.01); *Y02E 10/50* (2013.01); *Y02T 10/90* (2013.01)
USPC .......................................... 320/101; 136/245

(56) References Cited

U.S. PATENT DOCUMENTS

| | | | | |
|---|---|---|---|---|
| 6,448,740 | B1* | 9/2002 | Kirkpatrick | 320/101 |
| 7,692,404 | B2* | 4/2010 | Harris | 320/117 |
| 7,884,569 | B2* | 2/2011 | Ward | 320/101 |
| 8,120,308 | B2* | 2/2012 | Ward | 320/101 |
| 2009/0126775 | A1 | 5/2009 | White | |
| 2011/0073161 | A1 | 3/2011 | Scanlon | |
| 2011/0241604 | A1 | 10/2011 | Anderson | |

OTHER PUBLICATIONS

Geek, "Top 10 Solar Powered Concept Cars", Webpage at http://realitypod.com/2010/05/10-solar-powered-cars/>, May 28, 2010.

Avro, Solar Car Secretly Being Developed by Toyota Motor Corp., Webpage at http://www.consumerenergyreport.com/2009/01/01/solarcar-secretly-being-developed-by-toyota-motor-corp/, Jan. 1, 2009.

Cruz, SolarFan Gives your Gadgets Sun Power, Webpage at http://www.tomsguide.com/us/ambientec-folding-solar-panel,news-9782.html, Jan. 26, 2011.

Genzomedia, The Guardian, Solar Power—Electric Car Future Vehicle, Webpage at http://www.genzomedia.com/102010/the-guardian-solar-power-electric-car-future-vehicle/, Oct. 20, 2010.

Jolly, Eco Cars: Weird-looking solar car from Germany aims to win the World Solar Challenge, Webpage at http://www.ecofriend.com/entry/eco-cars-weird-looking-solar-car-from-germany-aims-to-win-the-world-solar-challenge/, Sep. 3, 2009.

Sanyo, Sanyo Displays Solar Electric Vehicle at Eco Products 2009 Exhibition, Webpage at http://www.vhxn.com/sanyo-displays-solar-electric-vehicle-at-eco-products-2009-exhibition/sanyosolarelectricvehicle/, accessed Feb. 16, 2012.

Simburger, Prius White Paper, webpage at http://www.solarelectricalvehicles.com/articles/prius-white-paper.shtml, accessed Feb. 16, 2012.

Yung, C.S. And Lansing, F.L. "Rates of Solar Angles for two-axis concentrators," TDA Progress Report 42-72, pp. 200-211 (1982).

Zarr, R., "A Case Study of Electric Vehicles," accessed at http://web.archive.org/web/20110511185542/http://energyzarr.typepad.com/energyzarrnationalcom/2008/06/a-case-study-of.html, posted on Jun. 23, 2008, pp. 1-4.

KPFA, "Exploration", at http://www.kpfa.org/archive/id/75567, Nov. 29, 2011, 1 page.

* cited by examiner

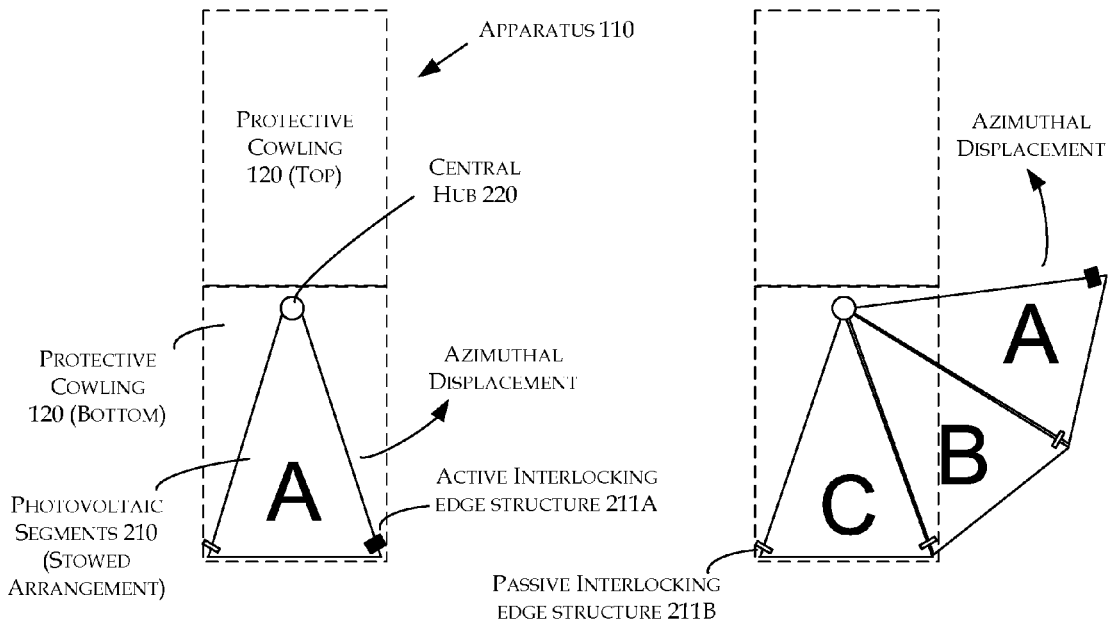
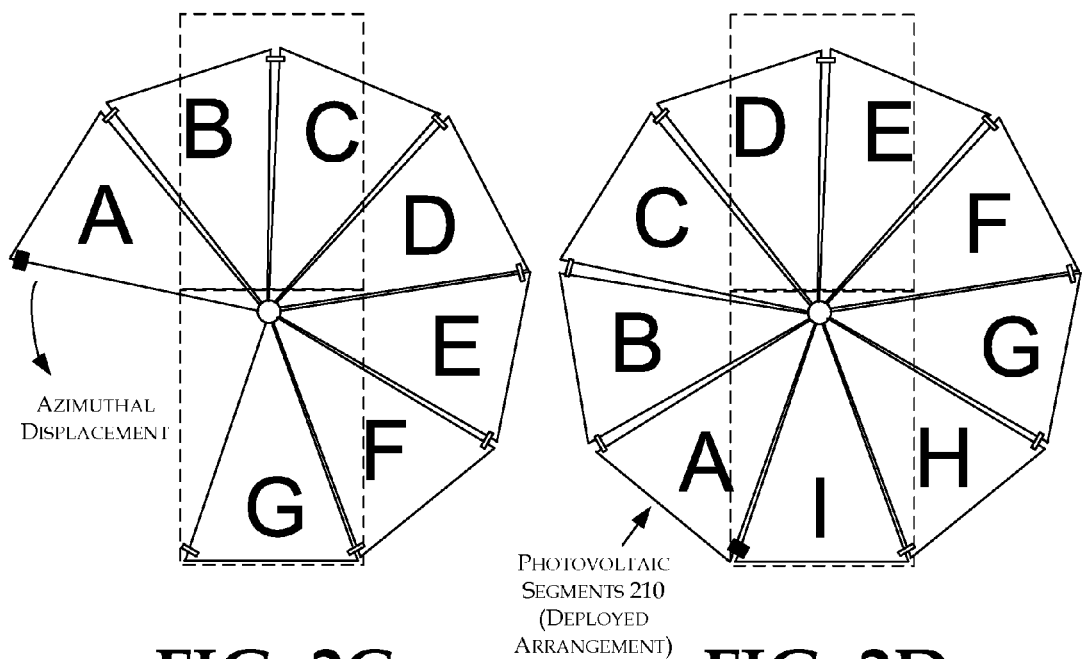
FIG. 2A  FIG. 2B
FIG. 2C  FIG. 2D

STOWABLE TRACKING PHOTOVOLTAIC ARRAY

CROSS-REFERENCE TO RELATED APPLICATIONS

Priority is claimed to PCT Application PCT/US2012/047965, entitled "STOWABLE TRACKING PHOTOVOLTAIC ARRAY", filed on Jul. 24, 2012.

BACKGROUND

Unless otherwise indicated herein, the materials described in this section are not prior art to the claims in this application and are not admitted to be prior art by inclusion in this section.

Photovoltaic energy, also referred to as solar power, is a promising aspect of our green-energy future. Photovoltaic arrays have been deployed with varying degrees of success in a variety of settings, including large scale utility applications, home roof top applications, satellites, and a large number of lightweight device applications. As photovoltaic technologies continue to improve, the role of photovoltaic energy in our daily lives will likely continue to expand.

While the use of photovoltaic energy to power electric vehicles has a long history, existing implementations remain experimental and have not achieved widespread commercial acceptance. Contestants in solar powered car races such as the World Solar Challenge in Australia, and the American Solar Challenge in the United States and Canada, have experimented with various approaches and technologies with the goal of using only solar power to race several thousand miles. The present disclosure appreciates that cost-effective commercial systems for powering or partially powering electric and/or hybrid electric vehicles with significant amounts of photovoltaic energy have not yet been reasonably achieved.

SUMMARY

The present disclosure generally describes technologies including devices, methods, and computer readable media relating to a photovoltaic array apparatus. Some example photovoltaic array apparatus may comprise a central hub, adjustable length struts, a plurality of photovoltaic segments coupled to the central hub and struts, and/or a control system. The control system may be configured to optionally open a protective cowling, to selectively position the photovoltaic segments between a stowed arrangement and a deployed arrangement, and to control the struts to dynamically orient the photovoltaic segments so as to maximize, or otherwise adjust, power collected from incident radiation, or otherwise position the photovoltaic segments to adjust effective surface of the photovoltaic segments exposed to incident radiation. In the stowed arrangement, the photovoltaic segments may be stacked, e.g., under the protective cowling. The control system may be configured to open the protective cowling by operating the adjustable length struts. The control system may be configured to operate a motor at the central hub to azimuthally displace the photovoltaic segments about the central hub, to selectively position the photovoltaic segments between the stowed arrangement and the deployed arrangement. Each of the photovoltaic segments may be configured to interlock with adjacent photovoltaic segments and a radial tension may be applied to the interlocked photovoltaic segments to increase structural stiffness. The control system may be configured to control the struts to dynamically orient the photovoltaic segments so as to maximize, or otherwise adjust, power collected from incident radiation, or otherwise position the photovoltaic segments to adjust effective surface of the photovoltaic segments exposed to incident radiation. For example, the photovoltaic segments may be dynamically positioned to track the sun as the angle of incident sunlight changes. The photovoltaic segments can be configured to supply a potential difference across electrical terminals when exposed to incident radiation, and the potential difference may be used, e.g., to charge a battery such as a battery of a vehicle, or for any other application.

Some example methods may include operating a motor and/or adjustable length struts with a control system to deploy photovoltaic segments, and operating the struts with the control system to dynamically orient the photovoltaic segments so as to maximize, or otherwise adjust, power collected from incident radiation, or otherwise position the photovoltaic segments to adjust effective surface of the photovoltaic segments exposed to incident radiation. Deploying the photovoltaic segments may selectively position the photovoltaic segments between a stowed arrangement and a deployed arrangement. In the stowed arrangement, the photovoltaic segments may be arranged in a stacked configuration, e.g., under a protective cowling. The control system may operate the struts to open the cowling, and may operate the motor to turn a central hub and azimuthally displace the photovoltaic segments into the deployed arrangement. In the deployed arrangement, the photovoltaic segments may be configured to interlock with adjacent segments, e.g., as they are azimuthally displaced. A radial tension may be applied to the deployed photovoltaic segments to increase structural stiffness. When the photovoltaic segments are deployed, the control system may dynamically position the photovoltaic segments with the adjustable length struts, e.g., to track the sun as the angle of incident sunlight changes. A potential difference across electrical terminals associated with the plurality of photovoltaic segments may be used to charge a battery such as a battery of a vehicle, or for any other application.

Some example control systems may comprise a user interface, a deployment control, and/or a positioning control. The user interface may be configured to respond to activation commands to selectively activate the deployment and positioning controls. The deployment control may be configured to operate, in response to activation controls, struts and/or a motor to deploy photovoltaic segments. The positioning control may be configured to control struts to dynamically position the deployed photovoltaic segments to adjust an effective surface of the photovoltaic segments exposed to incident radiation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 2A is a diagram illustrating a top view of the example photovoltaic array apparatus with the photovoltaic segments in a stowed arrangement;

FIG. 2B is a diagram illustrating a top view of the example photovoltaic array apparatus with the photovoltaic segments in a partially deployed arrangement;

FIG. 2C is a diagram illustrating a top view of the example photovoltaic array apparatus with the photovoltaic segments in a partially deployed arrangement;

FIG. 2D is a diagram illustrating a top view of the example photovoltaic array apparatus with the photovoltaic segments in a deployed arrangement;

Figure 1A:
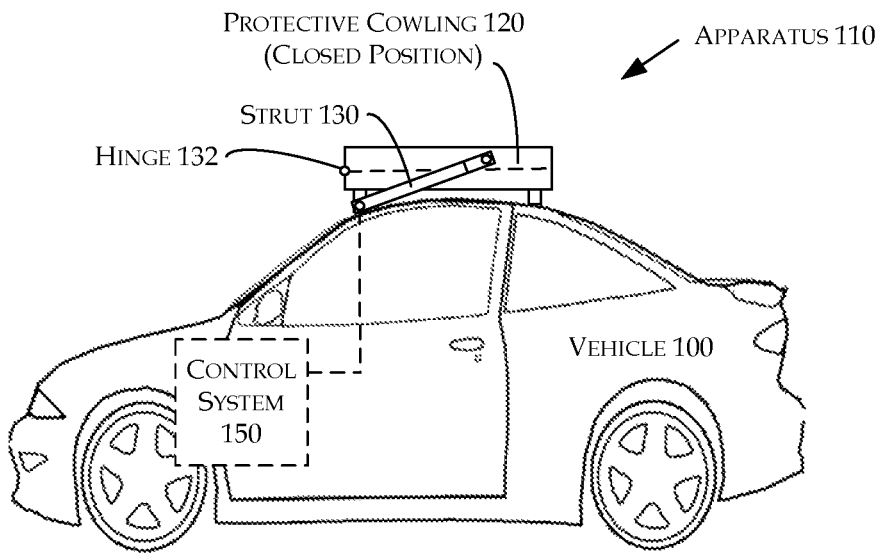
FIG. 1A is a diagram illustrating a side view of an example photovoltaic array apparatus on the roof of a vehicle, with photovoltaic segments in a stowed arrangement under an example protective cowling in a closed position.

all arranged in accordance with at least some embodiments of the present disclosure.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and made part of this disclosure.

The present disclosure is generally drawn, inter alia, to technologies including photovoltaic array apparatus, methods of operating photovoltaic array apparatus, control devices for use in photovoltaic array apparatus, and/or computer readable media deployed in control devices of photovoltaic array apparatus. Some example photovoltaic array apparatus may comprise a central hub, adjustable length struts, and/or a plurality of photovoltaic segments coupled to the central hub and struts. The photovoltaic segments may be selectively positioned between a stowed arrangement and a deployed arrangement by operation of the central hub and/or struts. In the stowed arrangement, the photovoltaic segments may be configured in a stacked arrangement, and in the deployed arrangement, the photovoltaic segments may be azimuthally displaced about the central hub. A control system coupled to the struts may be configured to selectively control the struts to dynamically orient the photovoltaic segments so as to maximize, or otherwise adjust, power collected from incident radiation, or otherwise position the photovoltaic segments to adjust effective surface of the photovoltaic segments exposed to incident radiation. For example, the control system may be configured to adjust effective surface to maximize effective surface exposed to incident radiation.

Figure 1B:
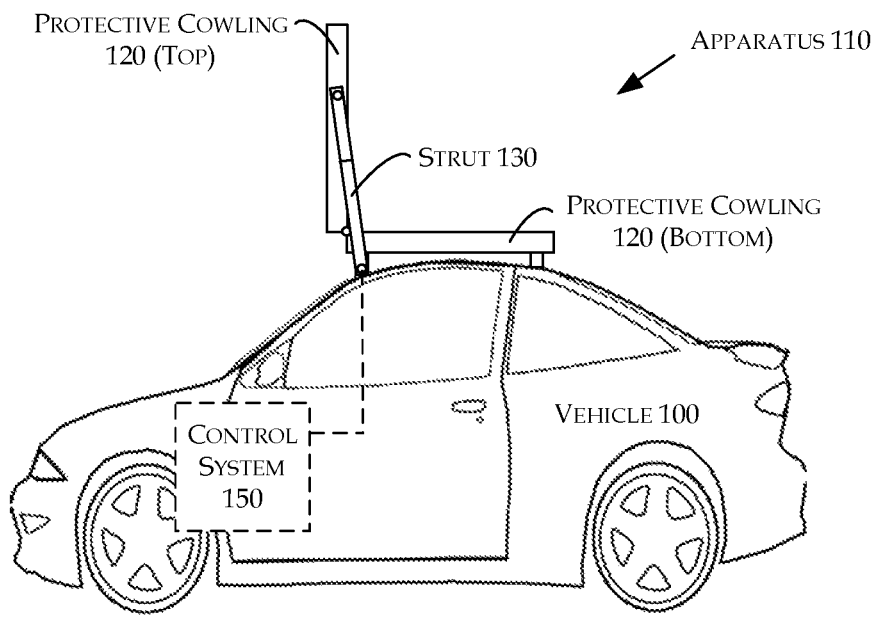
FIG. 1B is a diagram illustrating a side view of the example photovoltaic array apparatus with the example protective cowling in a partially open position.
Figure 1C:
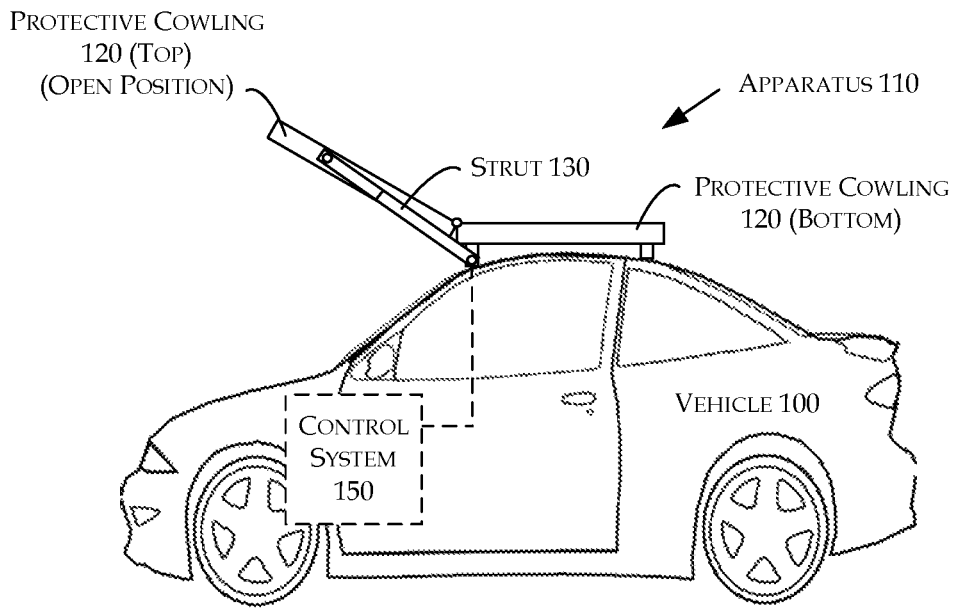
FIG. 1C is a diagram illustrating a side view of the example photovoltaic array apparatus with the example protective cowling in an open position.
Figure 1D:
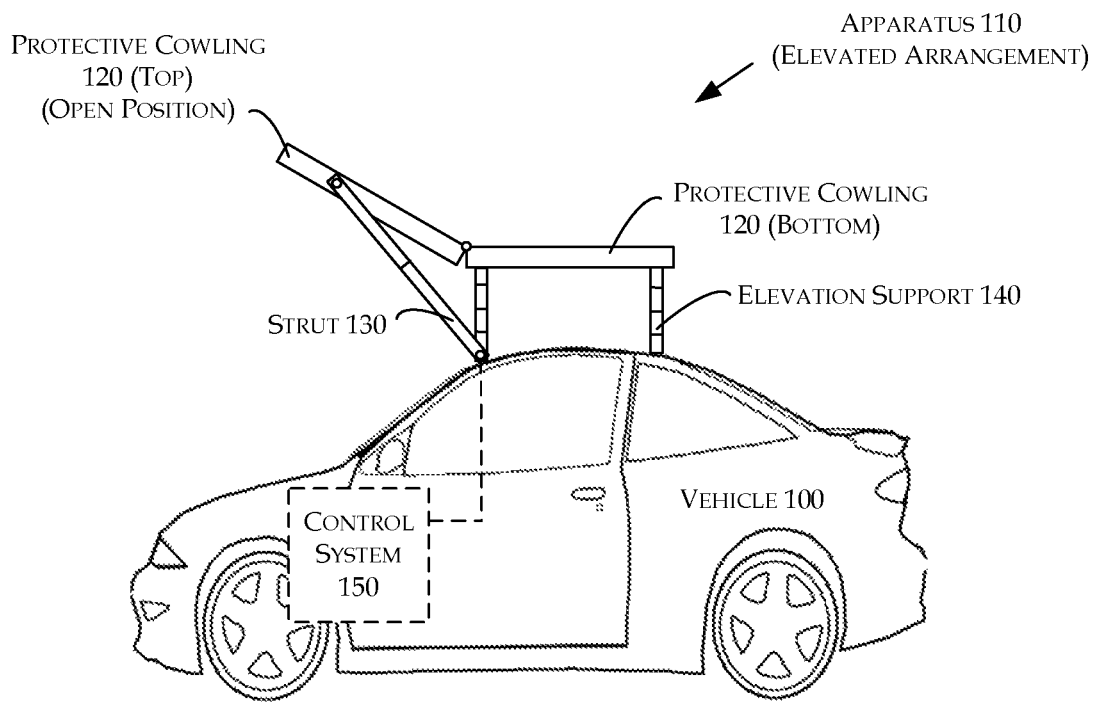
FIG. 1D is a diagram illustrating a side view of the example photovoltaic array apparatus with the example protective cowling in an open position, wherein the apparatus is raised above the roof of the vehicle.
Figure 1E:
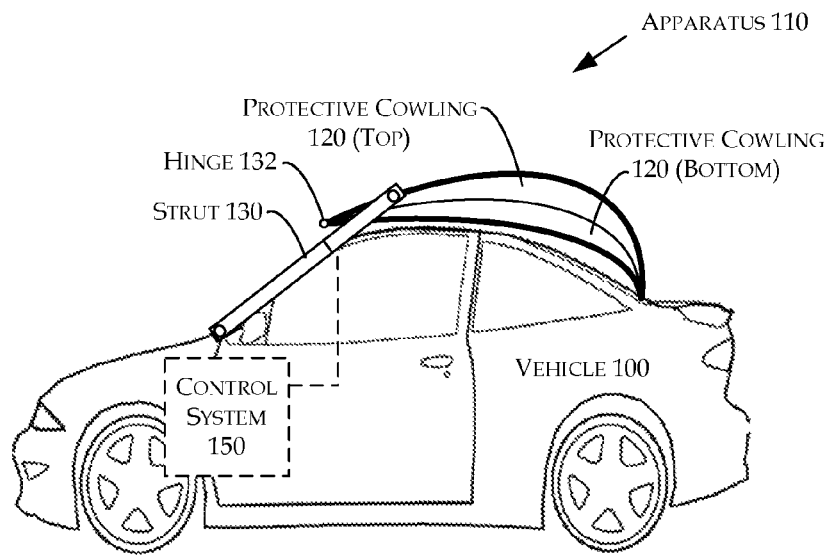
FIG. 1E is a diagram illustrating a side view of an example photovoltaic array apparatus on the roof of a vehicle, with photovoltaic segments in a stowed arrangement under an example protective cowling in a closed position.
Figure 1F:
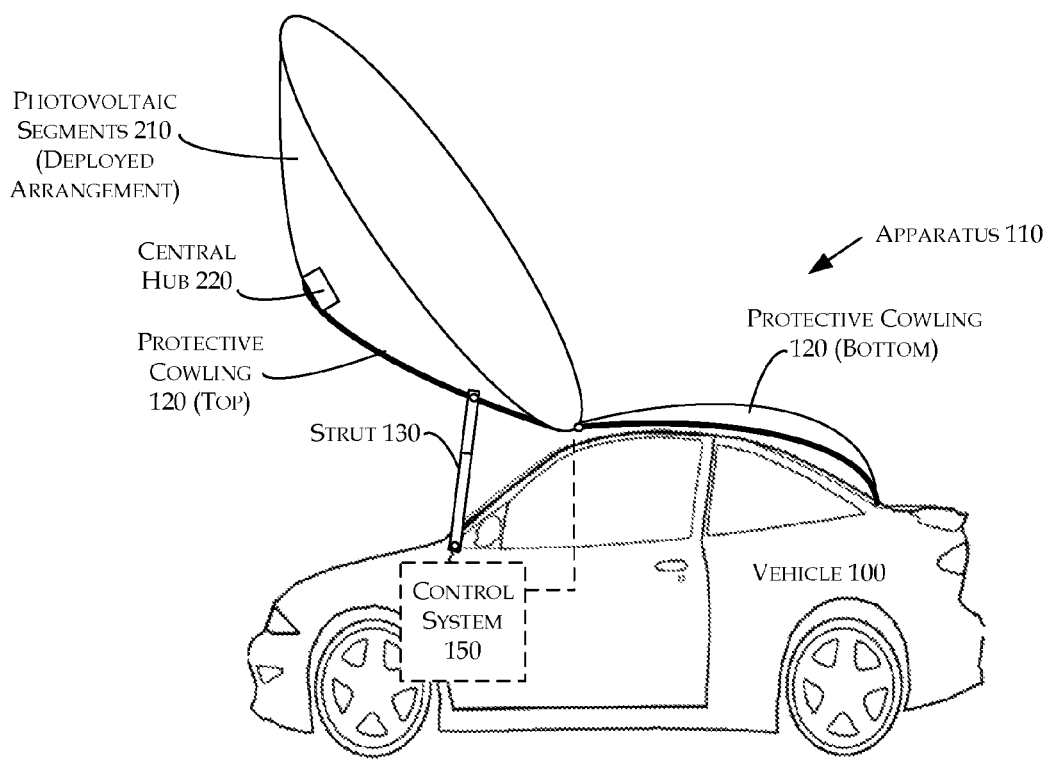
FIG. 1F is a diagram illustrating a side view of the example photovoltaic array apparatus with the example protective cowling in an open position and photovoltaic segments in a deployed arrangement.

FIGS. 1A, 1B, 1C, 1D, 1E, and 1F are diagrams illustrating side views of an example photovoltaic array apparatus 110 on the roof of a vehicle 100, arranged in accordance with at least some embodiments of the present disclosure. FIGS. 1A, 1B, 1C, 1D, 1E, and 1F may be referred to collectively as FIG. 1. Aspects of the apparatus 110 shown in FIG. 1 include a protective cowling 120, adjustable length strut 130, control system 150, and elevation support 140. FIGS. 1A, 1B, 1C, and 1D illustrate an example rectangular configuration, while FIGS. 1E and 1F illustrate an example aerodynamic and vehicle form-fitting configuration. In FIG. 1A, the cowling 120 is illustrated in a closed position. In FIG. 1B, the cowling 120 is partially open. In FIG. 1C, the cowling 120 is in an open position. In FIG. 1D, the cowling 120 is in an open position and the elevation supports 140 are extended to raise the cowling 120 above the roof of the vehicle 100. In FIG. 1E, the cowling 120 is illustrated in a closed position. In FIG. 1F, the cowling 120 is in an open position.

While not required for all embodiments, a protective cowling 120 in the closed position illustrated in FIG. 1A and FIG. 1E may be configured to protect the apparatus 110 from wind, weather, acceleration forces, and other wear and tear. The cowling 120 may be made from a durable, lightweight material such as hard plastic, fiberglass, or metal. In some embodiments, the cowling 120 may be configured with top and bottom portions joined by a hinge 132, as illustrated in FIG. 1. A wide variety of other arrangements are also possible, including, for example, arrangements with a top portion only, arrangements that open front-to-back, or arrangements that open to one or both sides (instead of back to front as shown), and arrangements configured to open slidably or otherwise.

In some embodiments, the protective cowling 120 may be configured to selectively move between a closed position, as shown in FIG. 1A and FIG. 1E, and an open position, as shown in FIG. 1C, FIG. 1D, and FIG. 1F. FIG. 1B illustrates the protective cowling 120 in a partially open/partially closed position as the protective cowling 120 moves between the closed to open positions, or vice versa. Opening the protective cowling 120 may be performed as part of an operation to deploy the photovoltaic segments 210 (illustrated in FIG. 1F and FIG. 2), and conversely, closing the protective cowling 120 may be performed as part of an operation to stow the photovoltaic segments 210. Photovoltaic segments 210 may be stacked in a stowed arrangement under the protective cowling 120 in the closed position. When the protective cowling 120 is in the open position shown in FIG. 1C, FIG. 1D, and FIG. 1F, the photovoltaic segments 210 may be positioned in a deployed arrangement, as shown in FIG. 1F and FIG. 2D.

The strut 130 may be coupled to the protective cowling 120 and may be configured to move the protective cowling 120 between the closed position and the open position, and vice-versa.

In some embodiments, the apparatus 110 may be configured with one strut 130, e.g., a strut 130 attached to one side of the cowling 120 as shown in FIG. 1. In some embodiments, the apparatus 110 may be configured with two struts 130, e.g., with one strut 130 attached to each of two different sides of the cowling 120. In some embodiments, more than two struts 130 may also be used. It will be appreciated that teachings applicable to the embodiments described herein are applicable to embodiments having any number of struts.

In some embodiments, one or more of the struts 130 may be configured to rotatably attach to both the top portion of the cowling 120 and to the vehicle 100, so that extension and retraction of the struts 130 may be utilized to facilitate opening and closing of the cowling 120. The struts 130 may be attached to any portion of the cowling 120 and to any location on the vehicle 100. Strut positioning may be selected to effectively control the opening and closing of the cowling 120 with extension and retraction of the struts 130, and to subsequently position deployed photovoltaic segments with the struts 130 as described further below.

In some embodiments, the struts 130 may comprise any adjustable length strut arrangement. For example, the struts may comprise hydraulic struts, pneumatic struts, or step-motor struts.

In some embodiments, the control system 150 may be coupled with the struts 130, and/or strut control devices associated with the struts 130, as discussed further below. The control system 150 may be configured effective to operate the struts 130 to selectively move the protective cowling 120 between the closed position and the open position, and vice-versa. For example, the control system 150 may be adapted to selectively extend and retract the struts 130 to control the opening and closing of the cowling 120.

In some embodiments, the struts 130 may be configured to allow the cowling 120 to open and close manually, or otherwise without operation of the control system 150. For example, the struts 130 may be configured with a release mechanism to allow manual extension or retraction of the struts 130, or a separate strut control device (not shown) may control the struts to open and close the cowling 120. When the cowling 120 is in an open position, the control system 150 may be configured to operate a motor to deploy the photovoltaic segments 210, as described below, and may be configured to selectively control the struts 130 to dynamically position the photovoltaic segments 210 to adjust an effective surface of the photovoltaic segments 210 exposed to incident radiation.

As described further below, the apparatus 110 may be configured to selectively control the strut(s) 130 to dynamically position deployed photovoltaic segments 210 (illustrated in FIG. 1F and FIG. 2) to adjust an effective surface of the photovoltaic segments 210 exposed to incident radiation. In embodiments comprising a cowling 120, the struts 130 may be coupled to the photovoltaic segments 210 via the cowling 120, and configured to dynamically position the deployed photovoltaic segments 210 with the struts 130. For example, in some embodiments, the struts 130 may be coupled to one or more photovoltaic segments 210 by couplings that extend through the cowling 120 and attach to a photovoltaic segment. In some embodiments, the cowling 120 may be configured to selectively lock into an open position, and support the photovoltaic segments 210 in the deployed arrangement so that positioning the photovoltaic segments 210 may be achieved by moving the cowling 120 with the struts 130.

In some embodiments, the apparatus 110 may be configured as an automotive add-on product, configured to removably attach to the vehicle 100. An add-on type apparatus 110 may comprise a control system 150 or portion thereof configured externally to the vehicle 100. For example, a control system 150 may be positioned above the vehicle's roof, and/or integrated with the cowling 120. An add-on type apparatus 110 may alternatively comprise a wired or wireless control system interface, configured to allow control of the apparatus 110 by a vehicle's "native" computer, that is, the computer installed in the vehicle by the vehicle manufacturer. Appropriate software may be supplied with the apparatus 110 to configure a vehicle computer as a control system 150 adapted to control the apparatus 110. An add-on type apparatus 110 may also comprise electrical terminals that may be selectively coupled to a vehicle battery or battery charging apparatus, for the purpose of selectively charging vehicle batteries.

In some embodiments, the apparatus 110 may be integrated into the vehicle 100 by the vehicle manufacturer at the factory and the apparatus 110 may form an integrated, non-removable part of the vehicle's design. In integrated embodiments, the apparatus 110 may be integrated into the vehicle's roof or trunk, and the protective cowling 120 may be configured to dynamically open with a sliding action similar to a sunroof or an extending/retracting action similar to a convertible rooftop. The vehicle 100 is illustrated in FIG. 1 as a motor vehicle, specifically, an automobile; however in some embodiments the vehicle 100 may comprise other motor vehicles such as a motorcycle, bus, or truck, or other vehicle such as a train. Much of the solar day for commuter vehicles is spent in the sun in parking lots and areas close to urban centers, where solar real estate will become increasingly valuable in our solar future. Charging during the day will contribute significantly to the practicality of using solar power for electrical vehicles for commuting.

In some embodiments, the apparatus 110 may also be configured to be used in non-vehicle applications, for example, in fixed-location battery charging applications where solar panels may be subject to high winds, snow/rain and ice, vandalism, or other conditions such that stowing solar panels is preferable to leaving them exposed.

FIG. 1D illustrates extendable elevation supports 140 configured to dynamically raise the protective cowling 120, including photovoltaic segments therein (as illustrated in FIG. 2) above a roof of the vehicle 100. In some embodiments, the control system 150 may be configured to selectively operate the extendable elevation supports 140, or a motor or other control device coupled to the extendable elevation supports 140, to dynamically raise the photovoltaic segments as part of deploying the photovoltaic segments, and conversely, to dynamically lower the extendable elevation supports 140 as part of stowing the photovoltaic segments. In some embodiments, raising the photovoltaic segments above the roof of a vehicle 100 may allow for the use of larger photovoltaic segments, increasing the photovoltaic capacity of the apparatus 110. When photovoltaic segments are raised, they may be less likely to interfere with other vehicles or persons that may park or walk next to the apparatus 110. In some embodiments, the control system 150 may be configured to adaptively operate the extendable elevation supports 140, or a motor or other control device coupled to the extendable elevation supports 140, along with the struts 130 to dynamically position the photovoltaic segments 210 to adjust effective surface of the photovoltaic segments 210 exposed to incident radiation.

FIG. 1E and FIG. 1F illustrate an example aerodynamic and vehicle form-fitting configuration for apparatus 110. In some embodiments, the apparatus 110 may be arranged in an aerodynamic shape, in which a forward portion of the apparatus 110 is thinner than a middle and/or rearward portion of the apparatus 110. For example, the shape of the protective cowling 120 in FIG. 1E and FIG. 1F is thinner toward the forward portion of the apparatus 110, and thicker in the middle portion of the apparatus 110. In some embodiments, the apparatus 110 may be arranged in a vehicle form-fitting shape, in which a shape of the apparatus 110 approximates or matches a shape of the vehicle 100. For example, the shape of the protective cowling 120 in FIG. 1E and FIG. 1F approximates the shape of the roofline of the vehicle 100.

FIG. 1E and FIG. 1F furthermore illustrate an example embodiment in which a central hub 220 is positioned at an outer portion of the top protective cowling 120, opposite hinge 132. Photovoltaic segments 210 may deploy about the central hub 220, as illustrated in FIG. 1F. Such embodiments may advantageously configure the top portion of the protective cowling 120 to provide structural support for the photovoltaic segments 210 in the deployed position, and to raise the central hub 220 high enough to allow walking clearance around the vehicle 100 while obtaining a large footprint to solar exposure. Embodiments according to FIG. 1E and FIG. 1F may or may not include elevation supports 140. Also, FIG. 1E and FIG. 1F illustrate an embodiment in which struts such as 130 attach to vehicle 100 alongside the windshield. In some embodiments, struts 130 may be integrated into the vehicle's frame, minimizing air drag. In some embodiments, struts 130 may be configured to position the central hub 220 above the vehicle 100, e.g., anywhere from several centimeters to several meters above the vehicle 100.

FIGS. 2A, 2B, 2C, and 2D are diagrams illustrating top views of the example photovoltaic array apparatus 110, arranged in accordance with at least some embodiments of the present disclosure. FIGS. 2A, 2B, 2C, and 2D may be referred to collectively as FIG. 2. Aspects of the apparatus 110 shown in FIG. 2 include the cowling 120, shown in the open position, a central hub 220, and photovoltaic segments 210 including segments A, B, C, D, E, F, G, H, and I. Active and passive interlocking edge structures 211A and 211B are shown coupled to adjacent photovoltaic segments. FIG. 2 illustrates azimuthal displacement of the photovoltaic segments 210 from a stowed arrangement, in FIG. 2A, in which the photovoltaic segments 210 are stacked, through partially deployed arrangements shown in FIGS. 2B and 2C, to a deployed arrangement shown in FIG. 2D.

In FIG. 2, each of the photovoltaic segments 210 may comprise a semi-rigid reinforced flexible photovoltaic material, which may be composed of several layers, e.g., as illustrated in FIG. 4. The plurality of photovoltaic segments 210 may be coupled to the central hub 220, wherein the photovoltaic segments 210 can be selectively positioned between the stowed arrangement of FIG. 2A and the deployed arrangement of FIG. 2D by operation of the central hub 220. A motor located at the central hub 220, such as motor 301 illustrated in FIG. 3, may be configured to azimuthally displace the photovoltaic segments 210 between the stowed arrangement and the deployed arrangement, and vice versa, by selectively turning the central hub 220. The control system 150 may be configured to selectively position the photovoltaic segments 210 between the stowed arrangement and the deployed arrangement by selective operation of the motor at the central hub 220.

In some embodiments, the central hub 220 may be attached to the bottom portion of protective cowling 120, and the photovoltaic segments 210 may be stacked on the bottom portion of protective cowling 120 in the stowed arrangement, as illustrated in FIG. 2. In some embodiments, the central hub 220 may be attached to the top portion of protective cowling 120, e.g., as illustrated in FIG. 1F. When the central hub 220 is attached to the top portion of protective cowling 120 the photovoltaic segments 210 may be stacked under the top portion of protective cowling 120 in the stowed arrangement, and may move with the top portion of protective cowling 120 when the protective cowling 120 is opened.

In some embodiments, the central hub 220 may be immovably attached to a first of the photovoltaic segments 210, e.g., to photovoltaic segment A, while the central hub 220 may be slidably attached to the remaining photovoltaic segments 210, e.g., to photovoltaic segments B, C, D, E, F, G, H, and I. The photovoltaic segments 210 may be deployed by turning the central hub 220 to rotate photovoltaic segment A. As photovoltaic segment A rotates about the central hub 220, each of the photovoltaic segments 210 may dynamically interlock with a next photovoltaic segment to pull the next photovoltaic segment out of the stacked position illustrated in FIG. 2A. The rotation of photovoltaic segment A is effective to pull the remaining photovoltaic segments 210 in the direction of azimuthal displacement to facilitate the deployment of the photovoltaic segments 210. The control system 150 may be configured to selectively operate in reverse to stow the photovoltaic segments 210, as discussed further below.

In some embodiments, the photovoltaic segments 210 may comprise interlocking edge structures such as 211A, 211B, configured to dynamically engage with the adjacent two of the photovoltaic segments as the photovoltaic segments 210 are azimuthally displaced. For example, FIG. 2D illustrates each of the photovoltaic segments 210 interlocked with its adjacent photovoltaic segments.

Interlocking edge structures may optionally comprise one or more active interlocking edge structures such as 211A, and one or more passive interlocking edge structures such as 211B. An active interlocking edge structure 211A is an edge structure that is actively controlled to interlock and decouple adjacent photovoltaic segments. An active interlocking edge structure 211A may comprise for example, an electromagnetic interlock device or an electrically or manually controlled latching device. In some embodiments, the control system 150 may be configured to selectively control active interlocking edge structures such as 211A. A passive interlocking edge structure 211B is an edge structure that dynamically interlocks and decouples adjacent photovoltaic segments by moving the photovoltaic segments 210, and does not require any separate control operation. An example passive interlocking edge structure 211B is illustrated in FIG. 4. In some embodiments, interlocking edge structures such as 211A, 211B may also comprise electrical couplings between two or more adjacent photovoltaic segments, as also discussed below in connection with FIG. 4.

In some embodiments, the apparatus may be configured with an active interlocking edge structure 211A between a leading photovoltaic segment A and a last photovoltaic segment I, as shown in FIG. 2D. Passive interlocking edge structures 211B may be adapted to interlock the edges of other adjacent photovoltaic segments, as shown in FIG. 2D. The control system 150 may be configured to selectively operate the active interlocking edge structure 211A to complete the interlocking of adjacent photovoltaic segments 210 in the deployed arrangement, and conversely to release the photovoltaic segments 210 from the deployed arrangement for return to the stowed arrangement.

Figure 3:
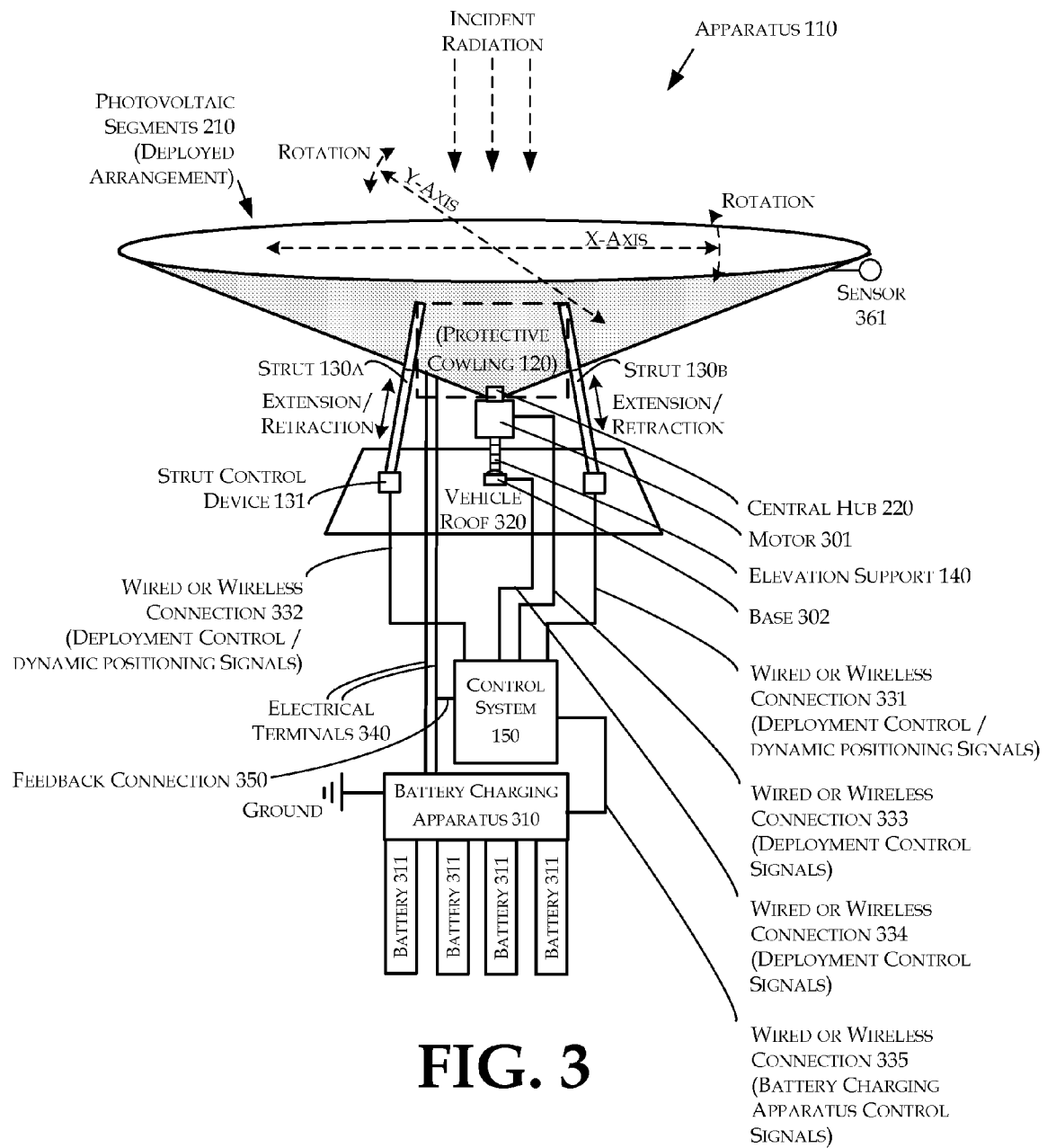
FIG. 3 is a diagram illustrating elements of the example photovoltaic array apparatus.

In some embodiments, operation of the active interlocking edge structure 211A may be configured to apply radial tension between the photovoltaic segments 210 effective to flex the deployed photovoltaic segments into a substantially concave shape, as shown in FIG. 3, to increase structural stiffness of the deployed photovoltaic segments 210. The control system 150 may be configured to operate the active interlocking edge structure 211A as part of deploying the photovoltaic segments 210. Other approaches and/or aspects of applying radial tension may include sizing the photovoltaic segments 210 such that completing the azimuthal displacement illustrated in FIG. 2 includes flexing the deployed photovoltaic segments into a substantially concave shape, as shown in FIG. 3. A motor 301 may be configured to overcome a material flex resistance of the photovoltaic segments 210 to complete the deployment thereof, such that that photovoltaic segment A (the first photovoltaic segment) may be positioned adjacent to and interlocked with photovoltaic segment I (the last photovoltaic segment).

In some embodiments, the photovoltaic segments 210 may be wedge-shaped such that the surface of the deployed photovoltaic segments is substantially circular in shape, as shown in FIG. 2D. However, it will be appreciated that by adjusting the size, such as length and width, and shape of the various photovoltaic segments 210, any size and shape of the deployed photovoltaic segments may be achieved. In some embodiments, the apparatus 110 may be configured to be attachable above an automobile or motorcycle, and in the deployed arrangement, the photovoltaic segments 210 may comprise one or more dimensions approximately the size of one or more dimensions of the automobile or motorcycle footprint. For example, a diameter of the circle illustrated in FIG. 2D may be within 25% of a length or width of a vehicle 100 upon which the apparatus 110 may be affixed. Since automobiles are often rectangular in footprint, in some embodiments the photovoltaic segments 210 may be configured to deploy into a substantially rectangular shape.

In a reverse operation, the photovoltaic segments 210 may be stowed by dynamically turning the central hub 220, e.g., by operating a motor 301 with the control system 150 configured to dynamically turn the central hub 220, to rotate photovoltaic segment A in a direction opposite the direction of azimuthal displacement indicated in FIG. 2. Starting from the deployed arrangement illustrated in FIG. 2D, the control system 150 may be configured to stow the photovoltaic segments 210 by selectively disengaging the active interlocking edge structure 211A, and selectively operating the motor 301 to turn the central hub 220, to return the photovoltaic segments 210 to the stowed arrangement illustrated in FIG. 2A. The passive interlocking edge structures 211B may be configured to selectively disengage and the photovoltaic segments 210 may be configured to slide into a stacked arrangement as the central hub turns to stow the photovoltaic segments 210. Example interlocking edge structures 211B that are configured to disengage and example photovoltaic segments 210 configured to slide into a stacked arrangement are illustrated in FIG. 4. When the photovoltaic segments 210 are returned to the stowed arrangement, the control system 150 may be configured to close the cowling 120 by selectively operating the struts 130 to position the cowling 120 from the open position illustrated in FIGS. 1C and 1D, to the closed position illustrated in FIG. 1A. The control system 150 may also be configured to selectively operate the elevation supports 140 to lower the apparatus 110.

FIG. 3 is a diagram illustrating elements of the example photovoltaic array apparatus 110, arranged in accordance with at least some embodiments of the present disclosure. FIG. 3 includes photovoltaic segments 210, shown in a deployed arrangement above a vehicle roof 320, in a substantially concave shape. FIG. 3 also includes example sensor 361, protective cowling 120, struts 130A and 130B, strut control devices 131, central hub 220, motor 301, elevation support 140, elevation support base 302, control system 150, battery charging apparatus 310, and batteries 311.

In FIG. 3, electrical terminals 340 electrically couple the photovoltaic segments 210 and the battery charging apparatus 310. The battery charging apparatus 310 is also coupled to an electrical ground. Wired or wireless connections 331, 332 couple the control system 150 and the strut control devices 131, allowing communication of deployment control and dynamic positioning signals. Wired or wireless connections 333, 334 may be configured to couple the control system 150 with the motor 301 and the elevation support base 302, respectively, allowing communication of deployment control signals. Wired or wireless connection 335 may be configured to couple the control system 150 with the battery charging apparatus 310, allowing communication of battery charging apparatus control signals.

In FIG. 3, the photovoltaic segments 210 are illustrated in a deployed arrangement. Deployment of the photovoltaic segments 210 may be achieved for example by optionally opening the protective cowling 120, azimuthally displacing the photovoltaic segments 210, and/or elevating the photovoltaic segments 210 with the elevation support 140 as discussed above with reference to FIG. 1 and FIG. 2. Once the photovoltaic segments 210 are deployed, the control system 150 may be configured to adaptively control the struts 130A, 130B to dynamically position the photovoltaic segments 210 to adjust effective surface of the photovoltaic segments 210 exposed to incident radiation.

In some embodiments, the incident radiation corresponds to energy from sunlight, and the control system 150 may be configured to orient the photovoltaic segments 210 to dynamically track the position of the sun. For example, in FIG. 3, the effective surface area of the photovoltaic segments 210 may be defined as the area of the projection of said segments normally onto a plane across the rim of the cone defined by the photovoltaic segments 210. The control system 150 may be configured to maintain the photovoltaic segments 210 in a position such that the plane across the rim of the cone defined by the photovoltaic segments 210 is substantially perpendicular to incident sunlight radiation. Stated another way, the control system 150 may be configured to dynamically position the photovoltaic segments such that their normal vectors, weighted by their respective active areas, are on average parallel to the incident radiation. Thus the control system 150 may be configured to orient the photovoltaic segments 210 so as to maximize effective surface exposed to incident radiation. The term "maximize" as used herein may encompass substantially maximizing, recognizing that perfect maximization may be unnecessary in all embodiments. Substantially maximizing may include, e.g., achieving a result that is anywhere from 75-100 percent of a theoretical maximum.

In some embodiments, the control system 150 may be configured to determine an angle of incident radiation by measurement, and the control system 150 may be configured to dynamically orient the photovoltaic segments 210 to a position substantially perpendicular a measured angle of incident radiation. In some embodiments, the control system 150 may be configured to determine angle of incident radiation by calculation, and the control system 150 may be configured to orient the photovoltaic segments 210 to a position substantially perpendicular to a calculated angle of incident radiation. In some embodiments, any technologies either currently available or as may be developed in the future for the purpose of tracking the sun with a photovoltaic array may be incorporated into the control system 150 and/or apparatus 110, and used to dynamically orient the photovoltaic segments 210 so as to maximize power collected from incident radiation.

The control system 150 may be configured to determine an angle of incident radiation by measurement using, for example, one or more sensors such as sensor 361 and/or a feedback from the photovoltaic segments 210. In embodiments using one or more sensors 361, the control system 150 may be configured to receive an output from one or more sensors 361 as an input to the control system 150. The control system 150 may be configured to perform a differential feedback calculation using received sensor inputs, and to use the differential feedback calculation results to dynamically position the photovoltaic segments 210. The control system 150 may be configured to perform a differential feedback calculation, for example, by storing a first received sensor input value associated with a first position of the photovoltaic segments 210, adjusting position of the photovoltaic segments 210 to a second position, storing a second received sensor input value associated with the second position of the photovoltaic segments 210, and finally comparing the first and second received sensor input values. The control system 150 may be configured for example to maintain and/or dynamically move the photovoltaic segments 210 into a position corresponding to the larger of the sensor inputs and/or a sensor input associated with a larger effective surface of the photovoltaic segments 210.

In embodiments using a feedback from the photovoltaic segments 210 to determine an angle of incident radiation by measurement, the control system 150 may be configured to receive a feedback output from the photovoltaic segments 210 as an input to the control system 150. For example, the control system 150 may be coupled to one or more electrical terminals 340 carrying an output of the photovoltaic segments 210 via a feedback connection 350. The control system 150 may be configured to perform a differential feedback calculation using received feedback connection inputs, in the same manner as described above with regard to received sensor inputs, and the control system 150 may be configured to use the differential feedback calculation results to dynamically position the photovoltaic segments 210, as described above.

In some embodiments, the control system 150 may be configured to perform differential feedback calculations as necessary to dynamically position the photovoltaic segments 210 to adjust effective surface of the photovoltaic segments 210 to maintain a position substantially perpendicular a measured angle of incident radiation. For example, differential feedback calculations may be performed initially upon deployment of the photovoltaic segments 210 in rapid succession, e.g., multiple times per second or per minute, to establish an initial position substantially perpendicular to incident radiation. After an initial position for the photovoltaic segments 210 is established, the control system 150 may be configured to subsequently perform differential feedback calculations corresponding position adjustments of the photovoltaic segments 210 at a slower rate, e.g. multiple times per minute to once or less per hour, to dynamically position the photovoltaic segments 210 to adjust effective surface of the photovoltaic segments 210 to maintain a position substantially perpendicular a measured angle of incident radiation.

In some embodiments, the control system 150 may be configured to determine angle of incident radiation by calculation by performing a calculation using orientation and time inputs. The control system 150 may include a clock, or may be configured to couple to a network, to obtain time of day and time of year information. The control system 150 may include a Global Positioning System (GPS) unit or other location technology to obtain latitude information. The control system 150 may include a compass to obtain orientation information. The control system 150 may include a level to obtain tilt angle information. Using some or all of the above information, the control system 150 may be configured to dynamically position the photovoltaic segments 210 according to one or more of time of day, time of year, latitude, orientation, and tilt angle of the apparatus 110. For example, the control system 150 may be configured to calculate an angle of incident sunlight relative to the apparatus 110 using one or more of time of day, time of year, latitude, orientation, and tilt angle of the apparatus 110. The control system 150 may be configured to dynamically position the photovoltaic segments 210 so that the effective surface of the photovoltaic segments 210 is substantially perpendicular to a calculated angle of incident sunlight.

While longitude and elevation information generally do not affect angle of incident radiation, the control system 150 may be configured to also obtain longitude information from the GPS unit or other location technology, and the control system 150 may include an altimeter to obtain elevation information. Longitude and elevation information may optionally be used in some embodiments, wherein such information proves useful in calculating an angle of incident sunlight relative to the apparatus 110. For example, precise latitude and longitude information may be useful in knowing local features such as tall buildings, mountains and the like which may temporarily block incident sunlight or otherwise affect angles of incident sunlight relative to the apparatus 110.

In some embodiments, the control system 150 may be configured to dynamically position the photovoltaic segments 210 along at least two rotational axes to adjust effective surface of the photovoltaic segments 210 exposed to incident radiation. For example, in FIG. 3, the control system 150 may be configured to dynamically position the photovoltaic segments 210 along the indicated X and Y rotational axes. The control system 150 may be configured to control two or more struts such as 130A, 130B to dynamically orient the photovoltaic segments 210 so as to maximize, or otherwise adjust, power collected from incident radiation, or otherwise position the photovoltaic segments to adjust effective surface of the photovoltaic segments exposed to incident radiation. The photovoltaic segments 210 may be selectively rotated in the plane of the X axis for example by dynamically extending or retracting strut 130A in an opposite direction as strut 130B. In other words, strut 130A may be extended while strut 130B is retracted, and vice versa. The photovoltaic segments 210 may be selectively rotated in the plane of the Y axis for example by dynamically extending or retracting struts 130A and 130B in unison. In other words, struts 130A and 130B may be extended simultaneously, or retracted simultaneously.

In some embodiments, the photovoltaic segments 210 may be configured to supply a potential difference across electrical terminals 340 when exposed to incident radiation, and a battery charging apparatus 310 may be electrically coupled to one or more of the electrical terminals 340 to effectuate charging of one or more batteries 311. The battery charging apparatus 310 may optionally be coupled to the control system 150 via a wired or wireless connection 335. Battery charging apparatus control signals may for example selectively activate and deactivate the battery charging apparatus 310, and may provide a battery charge level feedback to the control system 150. In some embodiments, the control system 150 may be configured to automatically deploy the photovoltaic segments 210 when the battery charge level is determined to be substantially less than fully charged. In some embodiments, the control system 150 may be configured to automatically stow the photovoltaic segments 210 when the battery charge level is determined to be substantially fully charged.

In some embodiments, the control system 150 may be configured to automatically position the photovoltaic segments 210 in the stowed arrangement in response to an input from a sensor 361, such as, for example, a safety sensor including one or more of a force sensor, accelerometer, or wind speed sensor. High winds and human vandalism may present a damage risk to the apparatus 110. The control system 150 may comprise, for example, safety sensor input channels coupled with one or more safety sensors. The safety sensor input channels may be configured with threshold values, and the control system 150 may be configured to respond to inputs in excess of threshold values by automatically stowing the photovoltaic segments 210 and closing the protective cowling 120. In some embodiments, the control system 150 may be configured to couple to a weather service via a network, and to stow and deploy the photovoltaic segments 210 in response to weather data received from the weather service. In some embodiments, the control system 150 may be configured to prevent or discourage driving of a vehicle while the photovoltaic segments 210 are in the deployed arrangement, e.g., by supplying an audible warning if the vehicle is turned on, and optionally disabling forward and/or reverse motion of the vehicle while the photovoltaic segments 210 are in the deployed arrangement. In some embodiments, the control system 150 may be configured to automatically deploy the photovoltaic segments 210 when the vehicle 100 is parked. In some embodiments, the control system 150 may be configured to automatically stow the photovoltaic segments 210 when a vehicle operator returns to the vehicle 100.

Figure 4A:
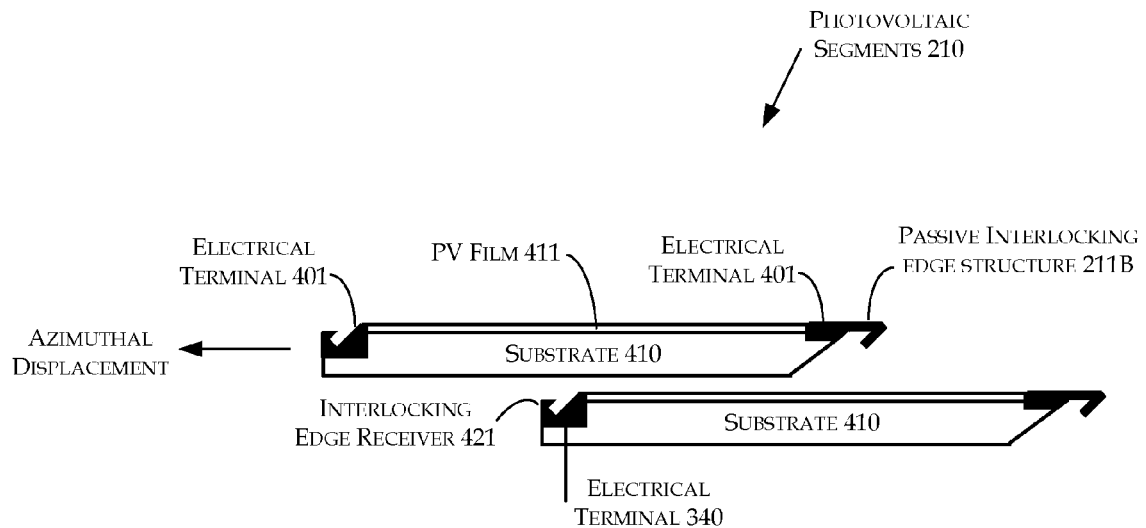
FIG. 4A is a diagram illustrating a first cross-section view of example photovoltaic segments.
Figure 4B:
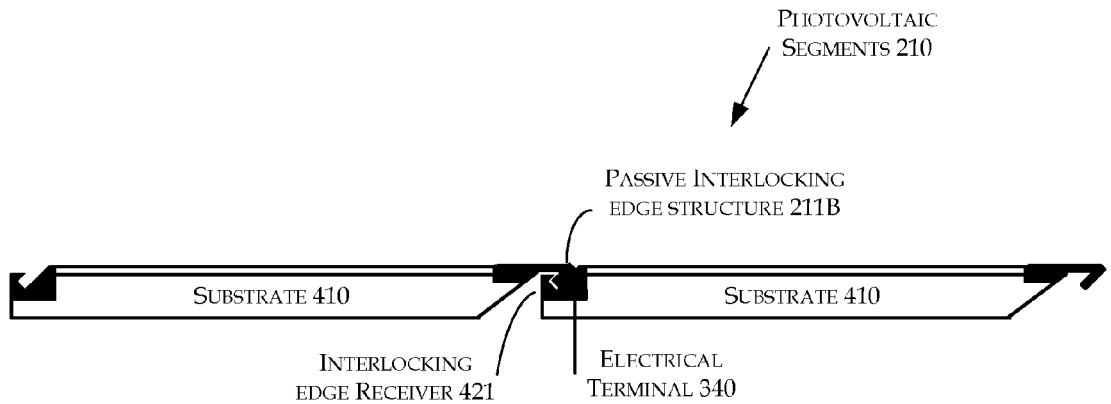
FIG. 4B is a diagram illustrating a second cross-section view of example photovoltaic segments.

FIGS. 4A and 4B are diagrams illustrating cross-section views of example photovoltaic segments, arranged in accordance with at least some embodiments of the present disclosure. FIGS. 4A and 4B may be referred to collectively as FIG. 4. FIG. 4 illustrates two photovoltaic segments 210, each comprising a layered substrate 410 and photovoltaic (PV) film 411. Electrical terminals 401 are disposed on the edges of the photovoltaic segments 210, and passive interlocking edge structures 211B engage interlocking edge receivers 421 and optionally provide electrical couplings between the photovoltaic segments 210 as the photovoltaic segments 210 are azimuthally displaced. FIG. 4A shows the photovoltaic segments 210 as azimuthal displacement is underway, and FIG. 4B shows interlocked adjacent photovoltaic segments 210, with the passive interlocking edge structure 211B engaged with interlocking edge receiver 421. An example electrical terminal 340 may extend from one of the electrical terminals 401 to a battery charging apparatus 310, as illustrated in FIG. 3.

In FIG. 4, the photovoltaic segments 210 each comprise a layered substrate 410 and PV film 411. The PV film 411 may be any PV film now in use or as may be developed in the future. In some embodiments, the PV film 411 may comprise a flexible film that can be affixed to the substrate 410 for example using adhesive glue or rivets. The substrate 410 may generally comprise a thin and lightweight plastic, metal, or other semi-flexible material designed to have stiffness and flexibility properties suitable for particular embodiments of the apparatus 110.

FIG. 4 illustrates an example embodiment of a passive interlocking edge structure 211B. Example passive interlocking edge structure 211B comprises a hooked tab configured to selectively engage and disengage with an interlocking edge receiver 421 of an adjacent photovoltaic segment. The angle of the hooked tab may increase the binding strength of the passive interlocking edge structure 211B. Also, the angled tab and angled edge of substrate 410 facilitates decoupling of the passive interlocking edge structure 211B and stacking of the photovoltaic segments 210 when the photovoltaic segments 210 are moved in the direction opposite the azimuthal displacement direction, e.g., to return the photovoltaic segments 210 to the stowed arrangement. In some embodiments, two or more interlocking edge structures may be used to interlock adjacent photovoltaic segments, such as may be desired to provide redundancy of the connection in case of component malfunction, and/or to increase structural strength of the photovoltaic segments 210 in the deployed arrangement.

In some embodiments, each of the photovoltaic segments 210 used in the apparatus 110 may comprise one or more electrical terminals of type 401, configured to electrically couple two or more photovoltaic segments in series. For example, each of the photovoltaic segments 210 may comprise "positive" and "negative" type electrical terminals across which a potential difference can be applied when a photovoltaic segment is exposed to incident radiation. The "positive" and/or "negative" type electrical terminals may be electrically coupled to terminals of type 401, to couple two or more photovoltaic segments in series. An electrical terminal 401 coupling two or more photovoltaic segments in series may be further coupled with an electrical terminal of type 340, which may be configured to supply a potential difference generated by the apparatus 110 to an output device such as a battery or battery charging apparatus.

In some embodiments, the electrical terminals 401 configured to electrically couple two or more photovoltaic segments in series may be combined with interlocking edge structures, e.g., as shown in FIG. 4. For example, a passive interlocking edge structure 211B may be configured to engage with an adjacent photovoltaic segment as the photovoltaic segments are azimuthally displaced. One or more of the interlocking edge structures 211B may be configured to electrically couple electrical terminals 401 configured to electrically couple two or more photovoltaic segments in series.

Figure 5:
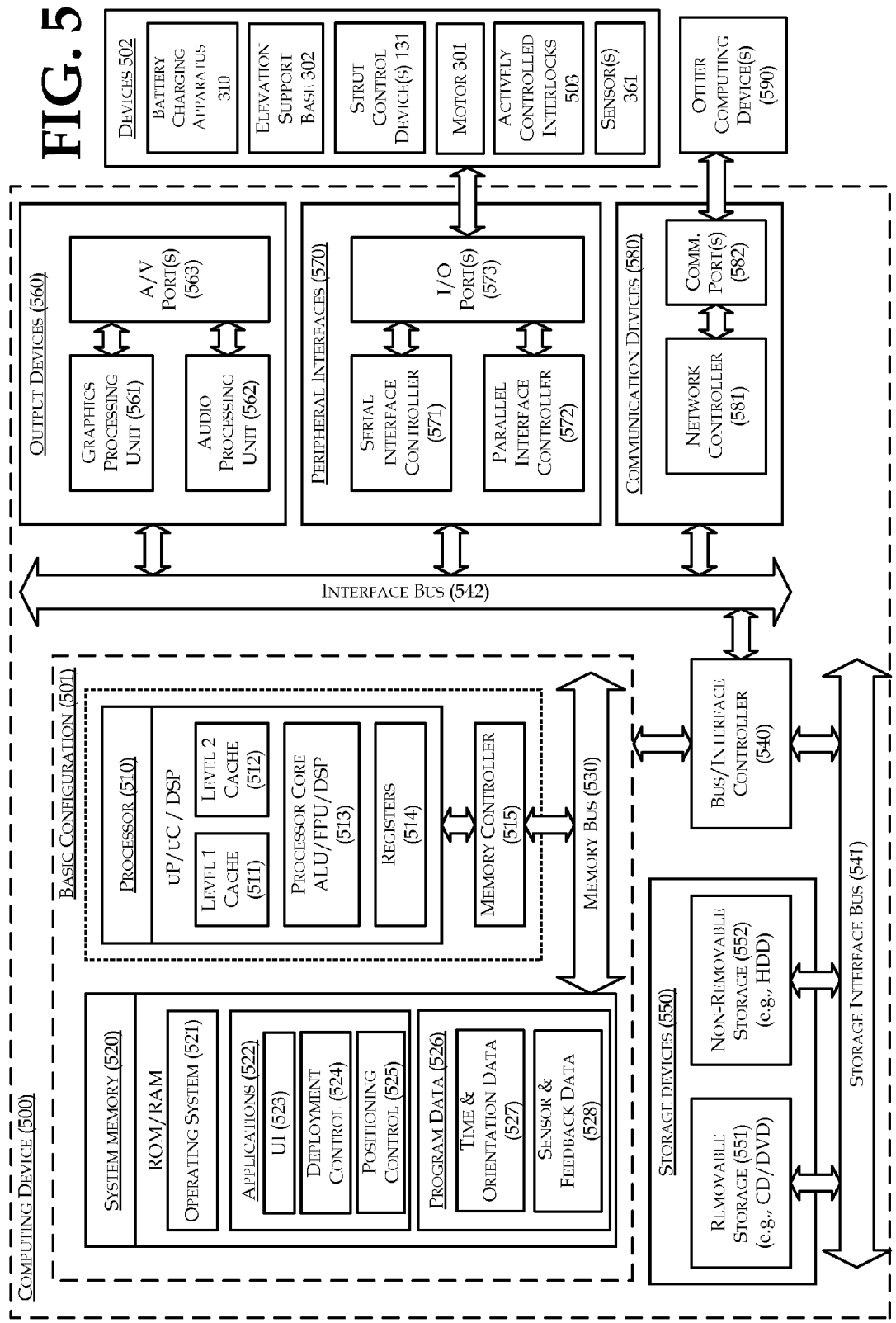
FIG. 5 is a block diagram illustrating a computing device as an example of a control system for a photovoltaic array apparatus.

FIG. 5 is a block diagram of a computing device 500 as one example of a control system 150, arranged in accordance with at least some embodiments of the present disclosure. In a very basic configuration 501, computing device 500 may include one or more processors 510 and system memory 520. A memory bus 530 may be used for communicating between the processor 510 and the system memory 520.

Depending on the desired configuration, processor 510 may be of any type including but not limited to a microprocessor (µP), a microcontroller (µC), a digital signal processor (DSP), or any combination thereof Processor 510 may include one or more levels of caching, such as a level one cache 511 and a level two cache 512, a processor core 513, and registers 514. The processor core 513 may include an arithmetic logic unit (ALU), a floating point unit (FPU), a digital signal processing core (DSP Core), or any combination thereof A memory controller 515 may also be used with the processor 510, or in some implementations the memory controller 515 may be an internal part of the processor 510.

Depending on the desired configuration, the system memory 520 may be of any type including but not limited to volatile memory (such as RAM), non-volatile memory (such as ROM, flash memory, etc.), or any combination thereof System memory 520 typically includes an operating system 521, one or more applications 522, and program data 526. Applications 523-525 may include, for example, User Interface (UI) module(s) 523, deployment control module(s) 524, and positioning control module(s) 525, which are discussed further below in connection with FIG. 6. Program data 527-528 may include time and orientation data 527 and sensor and feedback data 528 that may be used by applications 523-525.

Computing device 500 may have additional features or functionality, and additional interfaces to facilitate communications between the basic configuration 501 and any required devices and interfaces. For example, a bus/interface controller 540 may be used to facilitate communications between the basic configuration 501 and one or more data storage devices 550 via a storage interface bus 541. The data storage devices 550 may be removable storage devices 551, non-removable storage devices 552, or a combination thereof Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives, to name a few. Example computer storage media may include volatile and nonvolatile, removable and non-removable media implemented in any method or technology for storage of information, such as computer readable instructions, data structures, program modules, or other data.

System memory 520, removable storage 551, and non-removable storage 552 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 500. Any such computer storage media may be part of device 500.

Computing device 500 may also include an interface bus 542 for facilitating communication from various interface devices (e.g., output interfaces, peripheral interfaces, and communication interfaces) to the basic configuration 501 via the bus/interface controller 540. Example output devices 560 include a graphics processing unit 561 and an audio processing unit 562, which may be configured to communicate to various external devices such as a display or speakers via one or more A/V ports 563. Example peripheral interfaces 570 may include a serial interface controller 571 or a parallel interface controller 572, which may be configured to communicate through either wired or wireless connections with external devices 502 controlling motion and measurements associated with the apparatus 110 disclosed herein. Such devices 502 include battery charging apparatus 310, elevation support base 302, strut control device(s) 131, motor 301, an actively controlled interlock devices 503, and sensors 361. Common input devices (e.g., keyboard, mouse, pen, voice input device, touch input device, etc.) or other peripheral devices (e.g., printer, scanner, etc.) may also be coupled via one or more I/O ports 573. Other conventional I/O devices may be coupled as well such as a mouse, keyboard, and so forth. An example communications device 580 includes a network controller 581, which may be arranged to facilitate communications with one or more other computing devices 590 over a network communication via one or more communication ports 582.

The computer storage media may be one example of a communication media. Communication media may typically be embodied by computer readable instructions, data structures, program modules, or other data in a modulated data signal, such as a carrier wave or other transport mechanism, and include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media.

Computing device 500 may be implemented as a portion of an onboard vehicle computer, a personal computer including both laptop computer and non-laptop computer configurations, a small-form factor portable (or mobile) electronic device such as a mobile phone, an application-specific device, or a hybrid device that include any of the above functions.

Figure 6:
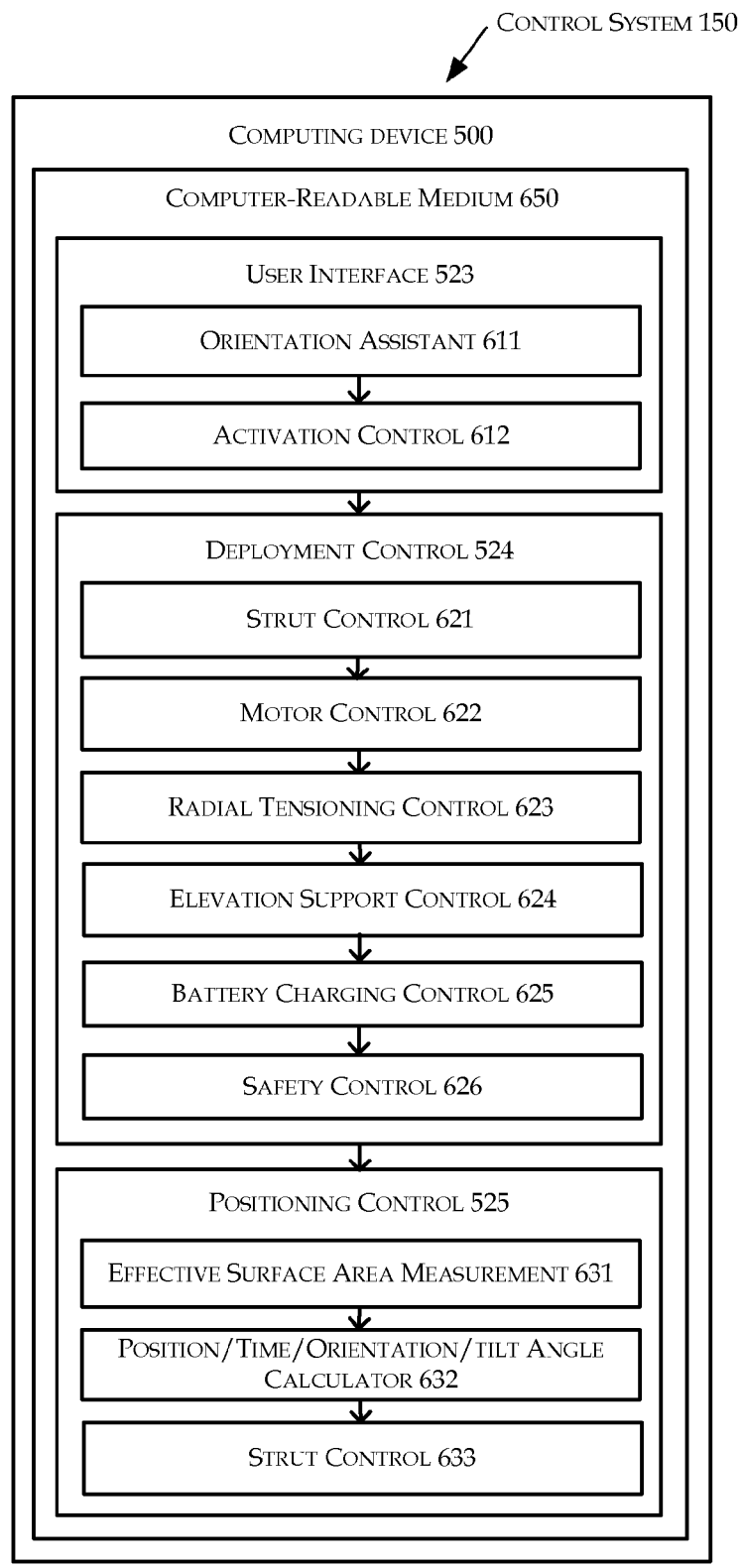
FIG. 6 is a block diagram illustrating an example computing device and computer readable medium, and corresponding methods and modules implementing a control system for a photovoltaic array apparatus.

FIG. 6 is a block diagram illustrating an example computing device 500 and computer readable medium 650, and corresponding methods and modules implementing a control system 150 for a photovoltaic array apparatus 110, arranged in accordance with at least some embodiments of the present disclosure. FIG. 6 includes a "User Interface" block 523, a "Deployment Control" block 524, and a "Positioning Control" block 525. The User Interface block 523 includes an "Orientation Assistant" block 611 and an "Activation Control" block 612. The Deployment Control block 524 includes a "Strut Control" block 621, a "Motor Control" block 622, a "Radial Tensioning Control" block 623, an "Elevation Support Control" block 624, a "Battery Charging Control" block 625, and a "Safety Control" block 626. The Positioning Control block 525 includes an "Effective Surface Area Measurement" block 631, a "Position/Time/Orientation/Tilt Angle Calculator" block 632, and a "Strut Control" block 633. The illustrated blocks and sub-blocks represent operations as may be performed in a method, functional modules in a device 500, and/or instructions as may be recorded on a computer readable medium 650.

In FIG. 6, the blocks 523, 524, and 525 and the various sub-blocks are illustrated as being performed sequentially, with block 523 first and block 525 last. It will be appreciated that the blocks as well as sub-blocks therein may be re-ordered as convenient to suit particular embodiments, and that these blocks or portions thereof may be performed concurrently in some embodiments. It will also be appreciated that in some examples various blocks may be eliminated, divided into additional blocks, located in separate devices, and/or combined with other blocks.

In general, the control system 150 illustrated in FIG. 6 may be configured to interact with a user via User Interface block 523, to selectively deploy and stow a photovoltaic array apparatus 110 via Deployment Control block 524, and to dynamically position photovoltaic segments to adjust effective surface thereof via Positioning Control block 525.

The User Interface block 523 may be configured with an "Orientation Assistant" block 611 and an "Activation Control" block 612. In general, the User Interface block 523 may be configured to optionally suggest an orientation for the apparatus 110 as described below, to receive user commands to selectively deploy and stow the photovoltaic segments 210 of the apparatus 110, and to selectively activate the Deployment Control block 524 in response to the received user commands.

The Orientation Assistant block 611 may be configured to calculate a suggested orientation for the apparatus 110, and provide the suggested orientation to a display. For example, depending on apparatus configuration, certain vehicle parking orientations may allow the apparatus 110 to track the sun more effectively than other parking orientations. An apparatus 110 may for example have greater range of motion on an axis perpendicular to a direction of vehicle motion, or conversely, an apparatus 110 may for example have greater range of motion on an axis parallel to a direction of vehicle motion. The Orientation Assistant block 611 may be configured to calculate the angles of incident radiation likely to be experienced by the apparatus 110 using one or more of latitude, time of year, time of day, and/or user behavior history.

For example, northerly and southerly latitudes will correspond to lower sun angles in the winter months—that is, lower than winter month sun angles near the equator. Northerly latitudes experience low southerly sun angles in the northern winter months such as December, January, February and March. Southerly latitudes experience low northerly sun angles in the southern winter months such as June, July, August and September. All latitudes will experience low sun angles in the east in the morning, low sun angles in the west in the evening, and higher sun angles in mid-day than morning and evening sun angles. The Orientation Assistant block 611 may be configured to calculate angles of incident radiation likely to be experienced by the apparatus 110 at least in part using latitude information. The Orientation Assistant block 611 may be configured to combine latitude information with time of year and/or time of day information to calculate the angles of incident radiation likely to be experienced by the apparatus 110 on any given time of any given day, at any given latitude. The Orientation Assistant block 611 may be configured to calculate angles of incident radiation with any desired degree of precision.

In some embodiments, the Orientation Assistant block 611 may be configured to calculate angles of incident radiation likely to be experienced by the apparatus 110 at least in part using user behavior history information, e.g., in addition to latitude information, time of year and/or time of day information. User behavior history information may be gathered using any number of techniques. For example, in some embodiments, a motion sensor may be configured to detect vehicle motion, and a clock may be configured to detect time of day and time of year (date) information. Motion and time/date information may be logged in a user behavior history database. The Orientation Assistant block 611 may be configured to determine one or more user behavior patterns from the user behavior history database. For example, the Orientation Assistant block 611 may determine that a user parks a vehicle all day when parking in the morning on a weekday, but parks a vehicle for several hours only when parking in the evening any day of the week or in the morning on a weekend.

The Orientation Assistant block 611 may be configured to calculate a suggested orientation for the apparatus 110 based on apparatus configuration, latitude, time of year, time of day, and/or user behavior history. For example, depending on apparatus configuration, the Orientation Assistant block 611 may suggest orienting a vehicle facing north in northern latitudes, or facing south in southern latitudes, to give the apparatus 110 the best possible radiation exposure throughout the time the vehicle is likely to remain parked. The Orientation Assistant block 611 may be configured to provide the suggested origination to a display such as an in-vehicle display screen, allowing a driver to park an automobile in the suggested orientation. The Orientation Assistant block 611 may be followed by the Activation Control block 612.

The Activation Control block 612 may be configured to respond to activation such as, for example, a user activation comprising a command to deploy the photovoltaic segments 210 and/or a user activation comprising a command to stow the photovoltaic segments 210. In response to an activation comprising a command to deploy the photovoltaic segments 210, the Activation Control block 612 may be configured to provide a deployment activation signal to the Deployment Control block 524 to deploy the photovoltaic segments 210. The Activation Control block 612 may optionally be configured to perform a safety check prior to activating the Deployment Control block 524. For example, the Activation Control block 612 may check one or more sensor inputs to determine whether the vehicle is in motion, whether the vehicle is turned on, whether the space surrounding the vehicle that may be occupied by the deployed photovoltaic segments 210 is clear, and whether any winds or other conditions may damage or otherwise impair the operation of the photovoltaic segments 210. The Activation Control block 612 may be configured to activate the Deployment Control block 524 only if the safety check is passed. In some embodiments, the Activation Control block 612 may optionally be configured to activate Positioning Control block 525 once the photovoltaic segments 210 are in the deployed arrangement, as described below. In response to an activation comprising a command to stow the photovoltaic segments 210, the Activation Control block 612 may be configured to activate the Deployment Control block 524 to stow the photovoltaic segments 210, including, in some embodiments, closing the cowling 120. The User Interface block 523 may be followed by the Deployment Control block 524.

The Deployment Control block 524 may be configured to perform operations to facilitate deploying the photovoltaic segments 210 to the deployed arrangement, and returning the photovoltaic segments 210 to the stowed arrangement. The Deployment Control block 524 may include a "Strut Control" block 621, a "Motor Control" block 622, a "Radial Tensioning Control" block 623, an "Elevation Support Control" block 624, a "Battery Charging Control" block 625, and a "Safety Control" block 626.

The Strut Control block 621 may be configured to selectively operate one or more struts 130 to dynamically open and close the protective cowling 120 under the control of the Deployment Control block 524. The Strut Control block 621 may be configured to operate the one or more struts 130 by transmitting deployment control signals to struts 130 or strut control devices 131 as illustrated in FIG. 3. The deployment control signals for strut control may comprise extension signals, retraction signals, or a sequence thereof. As described herein, the struts 130 may be coupled to the protective cowling 120 and may be configured to dynamically move the protective cowling 120 between the closed position and the open position, including opening and closing the protective cowling 120. The Strut Control block 621 may be configured to perform any sequence of extending and retracting the struts 130 to facilitate opening and closing of the protective cowling 120.

In some embodiments, the Deployment Control block 524 may be configured to operate the Strut Control block 621 to selectively open the protective cowling 120 in response to a deployment activation signal from the Activation Control block 612. The Deployment Control block 524 may be configured to selectively operate the Strut Control block 621 to close the protective cowling 120 in response to a stow activation signal from the Motor Control block 622. In a deployment operation, the Strut Control block 621 may be configured to signal the Deployment Control block 524 and/or the Motor Control block 622 when the protective cowling 120 is open. The Strut Control block 621 may be followed by the Motor Control block 622.

The Motor Control block 622 may be configured to dynamically operate a motor 301 to azimuthally displace photovoltaic segments 210 under the control of the Deployment Control block 524. The Motor Control block 622 may be configured to selectively operate the motor 301 by transmitting deployment control signals to the motor 301 as illustrated in FIG. 3. The deployment control signals may comprise a forward operation signal effective to operate the motor 301 in a first direction through a predetermined deployment angle, and a reverse operation signal effective to operate the motor 301 in a direction opposite the first direction through the predetermined deployment angle. The Motor Control block 622 may be configured to selectively operate the motor 301 in a first or forward rotation direction to selectively deploy the photovoltaic segments 210, and in a reverse direction opposite the first rotation direction to selectively stow the photovoltaic segments 210. Operation of the motor 301 may azimuthally displace photovoltaic segments 210 about the central hub 220, and each of the photovoltaic segments may dynamically interlock with adjacent photovoltaic segments as they are displaced.

In some embodiments, the Deployment Control block 524 may be configured to selectively operate the Motor Control block 622 to azimuthally displace the photovoltaic segments 210 into the deployed arrangement in response to a deployment activation signal from the Strut Control block 621. The Deployment Control block 524 may be configured to selectively operate the Strut Control block 621 to azimuthally displace the photovoltaic segments 210 into the stowed arrangement in response to a stow activation signal from the Radial Tensioning Control block 623. In a deployment operation, the Motor Control block 622 may be configured to signal the Deployment Control block 524 and/or the Radial Tensioning Control block 623 when the photovoltaic segments 210 are in the deployed arrangement. In a stow operation, the Motor Control block 622 may be configured to signal the Deployment Control block 524 and/or the Strut Control block 621 when the photovoltaic segments 210 are in the stowed arrangement. The Motor Control block 622 may be followed by the Radial Tensioning Control block 623.

The Radial Tensioning Control block 623 may be configured to selectively operate a radial tensioning device under the control of the Deployment Control block 524. The radial tensioning device may be configured to dynamically apply and release radial tension between each of the photovoltaic segments 210 effective to flex and release the deployed photovoltaic segments 210 into and from a substantially concave shape. A convex shape may also provide radial tension, and so may be suitable for some embodiments. A radial tensioning device may comprise for example an active interlocking edge structure device 211A configured to draw adjacent photovoltaic segments together. In some embodiments, a radial tensioning device may comprise the motor 301, wherein the motor 301 is configured to overcome a flex resistance of photovoltaic segments 210 in the deployed arrangement, as described above. The Radial Tensioning Control block 623 may be configured to operate the radial tensioning device by transmitting deployment control signals to the radial tensioning device as described above with regard to the operation of the motor 301 by the Motor Control block 622. The deployment control signals may comprise a tensioning signal operable to selectively activate the radial tensioning device to apply radial tension, and a release signal operable to selectively release the radial tensioning device to release radial tension.

In some embodiments, the Deployment Control block 524 may be configured to operate the Radial Tensioning Control block 623 to apply radial tension between the photovoltaic segments 210 in response to a deployment activation signal from the Motor Control block 622. The Deployment Control block 524 may be configured to operate the Radial Tensioning Control block 623 to selectively release radial tension between the photovoltaic segments 210 in response to a stow activation signal from the User Interface block 523, the Elevation Support Control block 624, or Safety Control block 626. In a deployment operation, the Radial Tensioning Control block 623 may be configured to signal the Deployment Control block 524 and/or the Elevation Support Control block 624 when radial tensioning by the radial tensioning device is complete. In a stow operation, the Radial Tensioning Control block 623 may be configured to signal the Deployment Control block 524 and/or the Motor Control block 622 when radial tensioning by the radial tensioning device is released. The Radial Tensioning Control block 623 may be followed by the Elevation Support Control block 624.

The Elevation Support Control block 624 may be configured to operate an extendable elevation support 140 configured to selectively raise and lower the photovoltaic segments 210 above a roof of an automobile or motorcycle under the control of the Deployment Control block 524. The Elevation Support Control block 624 may be configured to operate the one or more elevation supports 140 by transmitting deployment control signals to elevation supports 140 as illustrated in FIG. 3, or to elevation support control devices similar to the strut control devices 131. Deployment control signals for the elevation supports 140 may comprise raise and lower signals.

In some embodiments, the Deployment Control block 524 may be configured to operate the Elevation Support Control block 624 to raise the photovoltaic segments 210 at any stage of deployment, that is, in response to a deployment activation signals from User Interface block 523 or any of blocks 621, 622, and/or 623. The Deployment Control block 524 may be configured to operate the Elevation Support Control block 624 to selectively lower the photovoltaic segments 210 at any stage of stowing, that is, in response to a stow activation signals from User Interface block 523, or any of blocks 626, 623, 622 and/or 621. The Elevation Support Control block 624 may be followed by the Battery Charging Control block 625.

The Battery Charging Control block 625 may be configured to charge at least one battery with the photovoltaic segments 210 under the control of the Deployment Control block 524. The Battery Charging Control block 625 may be configured to selectively couple electrical terminals 340 of the photovoltaic segments 210 with a battery charging apparatus 310 in response to a deployment activation signal from the Deployment Control block 524, and the Battery Charging Control block 625 may be configured to selectively decouple electrical terminals 340 of the photovoltaic segments 210 with a battery charging apparatus 310 in response to a stow activation signal from the Deployment Control block 524. For example, the Battery Charging Control block 625 may be configured to selectively operate a switch in the battery charging apparatus 310. The Battery Charging Control block 625 may be followed by the Safety Control block 626.

The Safety Control block 626 may be configured to monitor one or more safety sensor input channels when the photovoltaic segments 210 are in the deployed arrangement, and to automatically return the photovoltaic segments 210 to the stowed arrangement in response to one or more received safety sensor input channel inputs. For example, the Safety Control block 626 may be configured to provide a stow activation signal to the Deployment Control block 524 and/or to the Elevation Support Control block 624 or Radial Tensioning Control block 623 to selectively initiate a stow operation when a safety sensor threshold value is surpassed, as previously described. The Deployment Control block 524 may be followed by the Positioning Control block 525.

The Positioning Control block 525 may be configured to control one or more struts 130 of the apparatus 110 to dynamically position the deployed photovoltaic segments 210 to adjust an effective surface of the photovoltaic segments 210 exposed to incident radiation. The Positioning Control block 525 may include an "Effective Surface Area Measurement" block 631, a "Position/Time/Orientation/Tilt Angle Calculator" block 632, and a "Strut Control" block 633.

The Effective Surface Area Measurement block 631 may be configured to receive measurements corresponding to an angle of incident radiation. Measurements may be received for example, from one or more light sensors or from a feedback connection between the photovoltaic segments 210 and the control system 150. The Positioning Control block 525 may be configured to use received measurements to dynamically position the photovoltaic segments 210 to adjust effective surface of the photovoltaic segments 210 to a position substantially perpendicular the angle of incident radiation. In some embodiments, the Effective Surface Area Measurement block 631 may operate in cooperation with the Position/Time/Orientation/Tilt Angle Calculator block 632, and in some embodiments, the Effective Surface Area Measurement block 631 may be replaced by the Position/Time/Orientation/Tilt Angle Calculator block 632.

The Position/Time/Orientation/Tilt Angle Calculator block 632 may be configured to determine one or more of time of day, time of year, latitude, orientation, and tilt angle of the apparatus 110. The Positioning Control block 525 may be configured to use determined time of day, time of year, latitude, orientation, and tilt angle of the apparatus 110 to dynamically position the photovoltaic segments to adjust effective surface of the photovoltaic segments to a position substantially perpendicular the angle of incident radiation. The Effective Surface Area Measurement block 631 and Position/Time/Orientation/Tilt Angle Calculator block 632 may be followed by the Strut Control block 633.

The Strut Control block 633 may be configured to control one or more adjustable length struts, or in some embodiments, two or more adjustable length struts, to dynamically orient the photovoltaic segments 210 so as to maximize, or otherwise adjust, power collected from incident radiation, or otherwise position the photovoltaic segments to adjust effective surface of the photovoltaic segments exposed to incident radiation. In some embodiments, the Strut Control block 633 may be configured to dynamically position the photovoltaic segments 210 along at least two rotational axes to adjust effective surface of the photovoltaic segments 210 exposed to incident radiation. As noted above, the dynamic positioning of the photovoltaic segments 210 may be accomplished using incident radiation angle measurements and/or calculations.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors and/or microcontrollers), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal-bearing medium used to actually carry out the distribution. Examples of a signal-bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber-optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/ or quantities). A typical data processing system may be implemented utilizing any suitable commercially available components, such as those typically found in data computing/communication and/or network computing/communication systems. The herein described subject matter sometimes illustrates different components contained within, or coupled with, different other components. It is to be understood that such depicted architectures are merely examples and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly inter-actable and/or wirelessly interacting components and/or logically interacting and/or logically inter-actable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While certain example techniques have been described and shown herein using various methods, devices and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

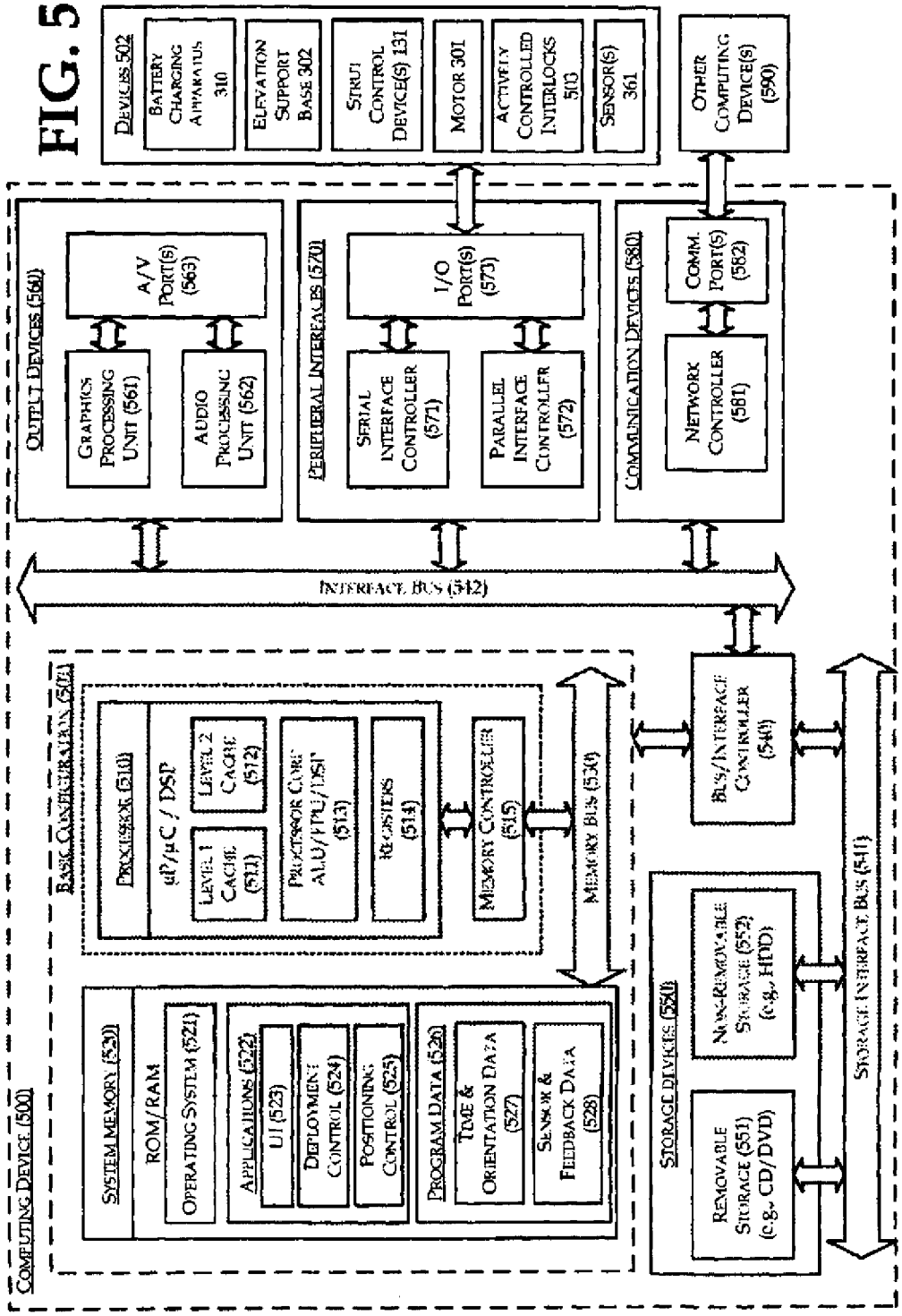

The invention claimed is:

1. An apparatus, comprising:
a central hub;
a plurality of photovoltaic segments coupled to the central hub, wherein the photovoltaic segments are selectively positioned between a stowed arrangement and a deployed arrangement by operation of the central hub, wherein:
   in the stowed arrangement, the photovoltaic segments are stacked;
   in the deployed arrangement, the photovoltaic segments are azimuthally displaced about the central hub, and each of the photovoltaic segments are interlocked with an adjacent two of the photovoltaic segments; and
   the plurality of photovoltaic segments are configured to supply a potential difference across electrical terminals in response to exposure to incident radiation;
at least one adjustable length strut coupled to the plurality of photovoltaic segments; and
a control system coupled to the at least one adjustable length strut, wherein the control system is configured to control the at least one adjustable length strut to dynamically orient the photovoltaic segments so as to adjust power collected from incident radiation, and wherein the control system is configured to dynamically position the photovoltaic segments such that their normal vectors, weighted by their respective active areas, are on average parallel to the incident radiation.

2. The apparatus of claim 1, further comprising a motor located at the central hub and configured to azimuthally displace the photovoltaic segments between the stowed arrangement and the deployed arrangement, and wherein the control system is further configured to selectively position the photovoltaic segments between the stowed arrangement and the deployed arrangement by activation of the motor.

3. The apparatus of claim 1, further comprising a protective cowling, wherein:
the protective cowling is selectively configured in either a closed position or an open position;
in the stowed arrangement, the photovoltaic segments are stacked under the protective cowling, and the protective cowling is configured in the closed position;
in the deployed arrangement of the photovoltaic segments, the protective cowling is configured in the open position; and
the at least one adjustable length strut is coupled to the protective cowling and configured to dynamically configure the protective cowling in either the closed position or the open position.

4. The apparatus of claim 3, wherein the control system is operable to configure the protective cowling in either the closed position or the open position by selective operation of the at least one adjustable length strut.

5. The apparatus of claim 1, wherein the incident radiation corresponds to energy from sunlight.

6. The apparatus of claim 1, further comprising a battery charger apparatus electrically coupled to one or more of the electrical terminals to enable one or more batteries to be charged.

7. The apparatus of claim 6, further comprising the one or more batteries electrically coupled to the battery charger apparatus.

8. The apparatus of claim 1, wherein the apparatus is attachable above a motor vehicle, and wherein in the deployed arrangement, the photovoltaic segments comprise one or more dimensions approximately a size of one or more dimensions of the motor vehicle footprint.

9. The apparatus of claim 1, wherein the at least one adjustable length strut comprises a hydraulic strut, a pneumatic strut, or a step-motor strut.

10. The apparatus of claim 1, wherein the at least one adjustable length strut comprises two or more adjustable length struts and wherein the control system is configured to control the two or more adjustable length struts to dynamically orient the photovoltaic segments so as to adjust power collected from incident radiation.

11. The apparatus of claim 1, wherein the photovoltaic segments comprise a semi-rigid reinforced flexible photovoltaic material.

12. The apparatus of claim 1, wherein the photovoltaic segments are wedge-shaped and of varied lengths, such that a surface of the deployed photovoltaic segments comprises one or more dimensions approximately a size of one or more dimensions of a motor vehicle footprint.

13. The apparatus of claim 1, wherein the photovoltaic segments comprise edge structures configured to be interlocked to selectively engage with the adjacent two of the photovoltaic segments as the photovoltaic segments are azimuthally displaced.

14. The apparatus of claim 1, wherein two or more of the photovoltaic segments each comprise one or more electrical terminals configured to electrically couple the two or more photovoltaic segments in series.

15. The apparatus of claim 14, wherein the photovoltaic segments comprise edge structures configured to be interlocked to engage with the adjacent two of the photovoltaic segments as the photovoltaic segments are azimuthally displaced, and wherein one or more of the interlocked edge structures is configured to electrically couple electrical terminals of the two or more photovoltaic segments in series.

16. The apparatus of claim 1, wherein the apparatus is further configured to apply radial tension between each of the photovoltaic segments effective to flex the deployed photovoltaic segments into a substantially concave shape.

17. The apparatus of claim 1, wherein the control system is configured to dynamically position the photovoltaic segments along at least two rotational axes to adjust an effective surface of the photovoltaic segments exposed to incident radiation.

18. The apparatus of claim 1, further comprising one or more light sensors coupled to the control system, and wherein the control system is configured to receive effective surface measurements from the one or more light sensors.

19. The apparatus of claim 1, further comprising a feedback structure between the photovoltaic segments and the control system, and wherein the control system is configured to receive effective surface measurements via the feedback structure.

20. The apparatus of claim 1, wherein the control system is configured to dynamically position the photovoltaic segments according to one or more of time of day, time of year, latitude, orientation, or tilt angle of the apparatus.

21. The apparatus of claim 1, further comprising an extendable elevation support configured to raise the photovoltaic segments above a roof of a motor vehicle.

22. The apparatus of claim 1, wherein the control system is further configured to automatically position the photovoltaic segments to the stowed arrangement in response to an input from one or more of a force sensor or a wind speed sensor.

23. The apparatus of claim 1, wherein the control system is further configured to calculate a suggested orientation for the apparatus, and to provide the suggested orientation to a display.

24. A method, comprising:
operating a motor with a control system to turn a central hub effective to azimuthally displace photovoltaic segments between a stowed arrangement and a deployed arrangement, wherein:
in the stowed arrangement, the photovoltaic segments are stacked;
in the deployed arrangement, the photovoltaic segments are azimuthally displaced about the central hub, and each of the photovoltaic segments are interlocked with an adjacent two of the photovoltaic segments; and
the plurality of photovoltaic segments are configured to supply a potential difference across electrical terminals in response to exposure to incident radiation; and
operating at least one adjustable length strut with the control system to dynamically position the photovoltaic segments to adjust an effective surface of the photovoltaic segments exposed to the incident radiation, such that normal vectors of the photovoltaic segments, weighted by their respective active areas, are on average parallel to the incident radiation.

25. The method of claim 24, further comprising operating the at least one adjustable length strut with the control system to selectively position a protective cowling between a closed position and an open position, wherein:
in the stowed arrangement, the photovoltaic segments are stacked under the protective cowling in the closed position; and
when the photovoltaic segments are in the deployed arrangement, the protective cowling is in the open position.

26. The method of claim 24, further comprising applying a radial tension between the photovoltaic segments to add structural stiffness to the photovoltaic segments at least in part by flexure of the deployed photovoltaic segments into a concave shape.

27. The method of claim 24, further comprising operating an extendable elevation support to raise the photovoltaic segments above a roof of a motor vehicle.

28. A control system, comprising:
 a user interface coupled to the control system, wherein the user interface is configured to receive a user activation;
 a deployment control coupled to the control system and configured to operate a motor in response to the user activation received at the user interface, wherein the motor is configured to azimuthally displace photovoltaic segments between a stowed arrangement and a deployed arrangement, and wherein:
  in the stowed arrangement, the photovoltaic segments are stacked;
  in the deployed arrangement, the photovoltaic segments are azimuthally displaced about the central hub, and each of the photovoltaic segments are interlocked with an adjacent two of the photovoltaic segments; and
  the plurality of photovoltaic segments are configured to supply a potential difference across electrical terminals in response to exposure to incident radiation; and
 a position control coupled to the control system and configured to control at least one adjustable length strut coupled to the plurality of photovoltaic segments to dynamically position the deployed photovoltaic segments to adjust an effective surface of the photovoltaic segments exposed to the incident radiation, such that normal vectors of the photovoltaic segments, weighted by their respective active areas, are on average parallel to the incident radiation.

29. The control system of claim 28, wherein the control system is configured within a vehicle.

30. The control system of claim 28, further comprising a safety control coupled to the control system and configured to automatically position the photovoltaic segments to the stowed arrangement in response to an input from one or more of a force sensor, an accelerometer, or a wind speed sensor.

31. The control system of claim 28, wherein the control system is further configured to calculate a suggested orientation for the photovoltaic segments, and provide the suggested orientation to a display.

* * * * *

UNITED STATES PATENT AND TRADEMARK OFFICE
CERTIFICATE OF CORRECTION

| | |
|---|---|
| PATENT NO. | : 8,933,660 B2 |
| APPLICATION NO. | : 13/810279 |
| DATED | : January 13, 2015 |
| INVENTOR(S) | : Heumann et al. |

Page 1 of 2

It is certified that error appears in the above-identified patent and that said Letters Patent is hereby corrected as shown below:

On the title page, item (75), under "Inventors", in Column 1, Line 1, delete "Michael C" and insert -- Michael C. --, therefor.

On the title page, item (75), under "Inventors", in Column 1, Line 2, delete "Stephan R" and insert -- Stephan R. --, therefor.

In the Drawings

In Fig. 5, Sheet 7 of 8, delete "UP/UC/DSP" and insert -- µP/µC/DSP --, therefor. (See attached)

In the Specification

In Column 1, Line 5, delete "APPLICATIONS" and insert -- APPLICATION --, therefor.

In Column 1, Lines 7-9, delete "Priority is claimed to PCT Application PCT/US2012/047965, entitled "STOWABLE TRACKING PHOTOVOLTAIC ARRAY", filed on Jul. 24, 2012." and insert -- The present application is a U.S. national stage filing under 35 U.S.C. §371 of International Application No. PCT/US2012/047965, entitled "STOWABLE TRACKING PHOTOVOLTAIC ARRAY", filed on Jul. 24, 2012. --, therefor.

In Column 14, Line 59, delete "thereof" and insert -- thereof. --, therefor.

In Column 14, Line 65, delete "thereof" and insert -- thereof. --, therefor.

In Column 15, Line 4, delete "thereof" and insert -- thereof. --, therefor.

In Column 15, Line 22, delete "thereof" and insert -- thereof. --, therefor.

Signed and Sealed this
Fourth Day of August, 2015

Michelle K. Lee
*Director of the United States Patent and Trademark Office*